US012772474B2

(12) United States Patent
Karamoto et al.

(10) Patent No.: US 12,772,474 B2
(45) Date of Patent: Oct. 20, 2026

(54) SEMICONDUCTOR DEVICE HAVING REDUCED RISK OF DIELECTRIC BREAKDOWN

(71) Applicant: FUJI ELECTRIC CO., LTD., Kawasaki (JP)

(72) Inventors: Yuki Karamoto, Matsumoto-city (JP); Kaname Mitsuzuka, Matsumoto-city (JP); Yoshihiro Ikura, Matsumoto-city (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 451 days.

(21) Appl. No.: 18/304,377

(22) Filed: Apr. 21, 2023

(65) Prior Publication Data

US 2023/0261096 A1 Aug. 17, 2023

Related U.S. Application Data

(63) Continuation of application No. PCT/JP2022/016190, filed on Mar. 30, 2022.

(30) Foreign Application Priority Data

May 24, 2021 (JP) ................................ 2021-087222

(51) Int. Cl.
*H10D 12/00* (2025.01)
*H10D 8/00* (2025.01)
(Continued)

(52) U.S. Cl.
CPC ........... *H10D 12/481* (2025.01); *H10D 8/422* (2025.01); *H10D 62/127* (2025.01); *H10D 64/513* (2025.01)

(58) Field of Classification Search
CPC .... H10D 12/481; H10D 8/422; H10D 62/127; H10D 64/513; H10D 64/117;
(Continued)

(56) References Cited

U.S. PATENT DOCUMENTS 10,522,674 B2 * 12/2019 Nasu .................... H10D 89/611
2012/0267711 A1 * 10/2012 Grebs .................. H10D 30/663
257/E29.264
(Continued)

FOREIGN PATENT DOCUMENTS

CN 103733344 A 4/2014
CN 112640129 A 4/2021
(Continued)

OTHER PUBLICATIONS

International Search Report and (ISA/237) Written Opinion of the International Search Authority for International Patent Application No. PCT/JP2022/016190, mailed by the Japan Patent Office on Jun. 28, 2022.

(Continued)

*Primary Examiner* — Mohammad M Hoque

(57) ABSTRACT

Provided is a semiconductor device including a semiconductor substrate. The semiconductor substrate has: an active portion; and a plurality of gate trench portions provided in the active portion on an upper surface of the semiconductor substrate and extending along an extending direction. The semiconductor device further includes: a gate runner provided between the active portion and an end side of the semiconductor substrate; and a plurality of gate polysilicon disposed apart from each other along the end side and respectively connecting the plurality of gate trench portions to the gate runner.

17 Claims, 19 Drawing Sheets

(51) Int. Cl.
*H10D 62/10* (2025.01)
*H10D 64/27* (2025.01)

(58) Field of Classification Search
CPC .. H10D 64/115; H10D 62/106; H10D 62/393; H10D 64/519
USPC .......................................................... 257/319
See application file for complete search history.

(56) References Cited

U.S. PATENT DOCUMENTS

| | | | | |
|---|---|---|---|---|
| 2013/0099311 | A1* | 4/2013 | Hao | H10D 64/517 257/334 |
| 2013/0214283 | A1 | 8/2013 | Briere | |
| 2014/0159107 | A1 | 6/2014 | Kurata | |
| 2015/0380538 | A1 | 12/2015 | Ogawa | |
| 2017/0084727 | A1 | 3/2017 | Naito | |
| 2017/0162662 | A1* | 6/2017 | Naito | H10D 64/519 |
| 2017/0170273 | A1* | 6/2017 | Naito | H10D 64/112 |
| 2017/0213902 | A1 | 7/2017 | Nishikawa | |
| 2017/0236908 | A1* | 8/2017 | Naito | H10D 62/60 257/48 |
| 2018/0096991 | A1* | 4/2018 | Nasu | H10D 84/811 |
| 2018/0269315 | A1 | 9/2018 | Kato | |
| 2018/0350900 | A1 | 12/2018 | Nakamata | |
| 2019/0096989 | A1* | 3/2019 | Yoshida | H10D 12/481 |
| 2019/0140084 | A1* | 5/2019 | Shirakawa | H10D 64/231 |
| 2019/0301946 | A1* | 10/2019 | Sato | H01L 24/48 |
| 2020/0161460 | A1 | 5/2020 | Harada | |
| 2021/0184024 | A1 | 6/2021 | Yoshida | |

FOREIGN PATENT DOCUMENTS

| | | | |
|---|---|---|---|
| JP | 2004221230 | A | 8/2004 |
| JP | 2014053552 | A | 3/2014 |
| JP | 2017112134 | A | 6/2017 |
| JP | 2017135245 | A | 8/2017 |
| JP | 2018157200 | A | 10/2018 |
| JP | 2018182279 | A | 11/2018 |
| JP | 2018206873 | A | 12/2018 |
| WO | 2015019862 | A1 | 2/2015 |
| WO | 2016098409 | A1 | 6/2016 |
| WO | 2019159657 | A1 | 8/2019 |

OTHER PUBLICATIONS

Office Action issued for counterpart Japanese Application No. 2023-524066, transmitted from the Japanese Patent Office on Jul. 2, 2024 (drafted on Jun. 24, 2024).

Office Action issued for counterpart Chinese Application 202280007099.0, issued by The State Intellectual Property Office of People's Republic of China on Jul. 18, 2026.

* cited by examiner

SEMICONDUCTOR DEVICE HAVING REDUCED RISK OF DIELECTRIC BREAKDOWN

The contents of the following Japanese patent application(s) are incorporated herein by reference:

NO. 2021-087222 filed in JP on May 24, 2021

NO. PCT/JP2022/016190 filed in WO on Mar. 30, 2022

BACKGROUND

1. Technical Field

The present invention relates to a semiconductor device.

2. Related Art

Conventionally, in a semiconductor device such as an insulated gate bipolar transistor (IGBT), it is known that dielectric breakdown occurs due to holes generated in an edge termination region (see, for example, Patent Document 1). In addition, a configuration in which a gate polysilicon layer is provided as a gate runner is known (see, for example, Patent Document 2). In addition, a technique for enhancing a reliability of a gate runner is known (see, for example, Patent Document 3).

Patent Document 1: Japanese Patent Application Publication No. 2018-206873

Patent Document 2: International Publication No. 2016-098409

Patent Document 3: Japanese Patent Application Publication No. 2017-135245

DETAILED DESCRIPTION OF THE PREFERRED EMBODIMENTS

Figure 1:
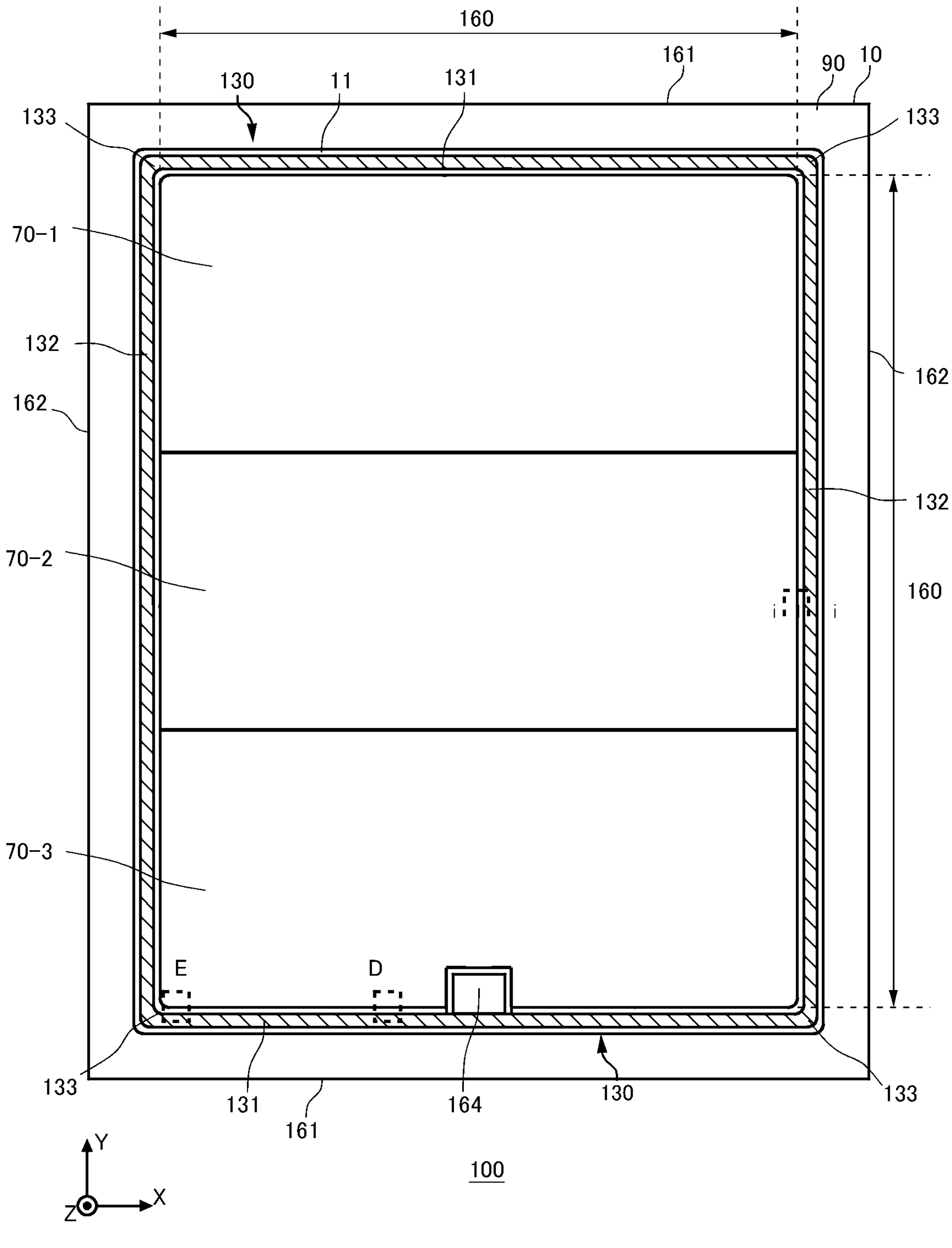
FIG. 1 is a top view illustrating an example of a semiconductor device 100.

Hereinafter, the present invention will be described through embodiments of the invention, but the following embodiments do not limit the invention according to the claims. In addition, not all of the combinations of features described in the embodiments are essential to the solving means of the invention.

As used in the present specification, one side in a direction parallel to a depth direction of a semiconductor substrate is referred to as "upper" and the other side is referred to as "lower". One of two main surfaces of a substrate, a layer or other member is referred to as an "upper surface", and the other surface is referred to as a "lower surface". "Upper" and "lower" directions are not limited to a direction of gravity, or a direction in which a semiconductor device is mounted.

As used herein, technical matters may be described with orthogonal coordinate axes consisting of an X axis, a Y axis, and a Z axis. The orthogonal coordinate axes are merely for specifying relative positions of components, and thus not for limiting to a specific direction. For example, the Z axis is not limited to indicate a height direction with respect to the ground. A +Z axis direction and a −Z axis direction are directions opposite to each other. When a direction is referred to as a "Z axis direction" without these "+" and "−" signs, it means the Z axis direction is parallel to +Z and −Z axes.

In the present specification, orthogonal axes parallel to the upper surface and the lower surface of the semiconductor substrate are referred to as the X axis and the Y axis. Further, an axis perpendicular to the upper surface and the lower surface of the semiconductor substrate is referred to as the Z axis. As used herein, a direction of the Z axis may be referred to as a depth direction. Further, in the present specification, a direction parallel to the upper surface and the lower surface of the semiconductor substrate may be referred to as a horizontal direction, including an X axis direction and a Y axis direction.

Further, a region from the center of the semiconductor substrate in the depth direction to the upper surface of the semiconductor substrate may be referred to as an upper surface side. Similarly, a region from the center of the semiconductor substrate in the depth direction to the lower surface of the semiconductor substrate may be referred to as a lower surface side.

As used herein, phrases such as "same" or "equal" may be used even when there is an error caused due to a variation in a manufacturing step or the like. This error is within a range of 10% or less, for example.

In the present specification, a conductivity type of a doping region where doping has been carried out with an impurity is described as a P type or an N type. In the present specification, the impurity may particularly mean either a donor of the N type or an acceptor of the P type, and may be described as a dopant. In the present specification, doping means introducing the donor or the acceptor into the semiconductor substrate and turning it into a semiconductor showing a conductivity type of the N type, or a semiconductor showing a conductivity type of the P type.

In the present specification, a doping concentration means a concentration of the donor or a concentration of the acceptor in a thermal equilibrium state. In the present specification, a net doping concentration means a net concentration obtained by adding the donor concentration set as a positive ion concentration to the acceptor concentration set as a negative ion concentration, taking polarities of charges into account. As an example, when the donor concentration is referred to as ND and the acceptor concentration is referred to as NA, the net doping concentration at any position is given as ND-NA. In the present specification, the net doping concentration may be simply referred to as the doping concentration.

The donor has a function of supplying electrons to a semiconductor. The acceptor has a function of receiving electrons from the semiconductor. The donor and acceptor are not limited to the impurities themselves. For example, a VOH defect which is a combination of a vacancy (V), oxygen (O), and hydrogen (H) existing in the semiconductor functions as the donor that supplies electrons. In the present specification, the VOH defect may be referred to as a hydrogen donor.

A P+ type or an N+ type described in the present specification means a doping concentration higher than that of the P type or the N type, and a P− type or an N− type described herein means a doping concentration lower than that of the P type or the N type. In the specification, a unit system is the SI base unit system unless otherwise particularly noted. Although a unit of length is represented using cm, it may be converted to meters (m) before calculations.

A chemical concentration in the present specification refers to an atomic density of an impurity measured regardless of an electrical activation state. The chemical concentration (an atomic density) can be measured by, for example, secondary ion mass spectrometry (SIMS). The net doping concentration described above can be measured by capacitance-voltage profiling method (CV method). Further, a carrier density measured by a spreading resistance method (SR method) may be set as the net doping concentration. The carrier density measured by the CV method or the SR method may be set as a value in a thermal equilibrium state. Further, in a region of N type, the donor concentration is sufficiently higher than the acceptor concentration, and therefore, the carrier density in the region may be set as the donor concentration. Similarly, in a region of P type, the carrier density in the region may be set as the acceptor concentration. In the present specification, the doping concentration of the N type region may be referred to as the donor concentration, and the doping concentration of the P type region may be referred to as the acceptor concentration.

Further, when a concentration distribution of the donor, acceptor, or net doping has a peak, a value of the peak may be set as the concentration of the donor, acceptor, or net doping in the region. When the concentration of the donor, acceptor or net doping is approximately uniform in a region, or the like, an average value of the concentration of the donor, acceptor or net doping in the region may be set as the concentration of the donor, acceptor or net doping. In the present specification, atoms/$cm^3$ or /$cm^3$ is used to indicate a concentration per unit volume. This unit is used for a concentration of a donor or an acceptor in a semiconductor substrate, or a chemical concentration. A notation of atoms may be omitted.

The carrier concentration measured by the SR method may be lower than the concentration of the donor or the acceptor. In a range where a current flows when a spreading resistance is measured, the carrier mobility of the semiconductor substrate may be lower than a value of that in a crystalline state. The reduction in carrier mobility occurs when carriers are scattered due to disorder (disorder) of a crystal structure due to a lattice defect or the like.

The concentration of the donor or the acceptor calculated from the carrier density measured by the CV method or the SR method may be lower than a chemical concentration of an element representing the donor or the acceptor. As an example, in a silicon semiconductor, a donor concentration of phosphorous or arsenic serving as a donor or an acceptor concentration of boron (boron) serving as an acceptor is substantially 99% of chemical concentrations of these. On the other hand, in the silicon semiconductor, a donor concentration of hydrogen serving as a donor is approximately 0.1% to 10% of a chemical concentration of hydrogen. Each concentration in the present specification may be a value at room temperature. As an example, a value at 300K (Kelvin) (substantially 26.9 degrees C.) may be used for a value at room temperature.

FIG. 1 is a top view illustrating an example of a semiconductor device 100. FIG. 1 illustrates a position at which each member is projected on an upper surface of a semiconductor substrate 10. In FIG. 1, only some members of the semiconductor device 100 are shown, and illustrations of some members are omitted.

The semiconductor device 100 includes the semiconductor substrate 10. The semiconductor substrate 10 is a substrate that is formed of a semiconductor material. Although the semiconductor substrate 10 is a silicon substrate by way of example, the material of the semiconductor substrate 10 is not limited to silicon.

The semiconductor substrate 10 has a first end side 161 and a second end side 162 in a top view. When merely referred to as the top view in the present specification, it means that the semiconductor substrate 10 is viewed from an upper surface side. The semiconductor substrate 10 of the present example has two sets of first end sides 161 facing each other in a top view. In addition, the semiconductor substrate 10 of the present example has two sets of second end sides 162 facing each other in a top view. In FIG. 1, the first end side 161 is parallel to the X axis direction. The second end side 162 is parallel to the Y axis direction. In addition, the Z axis is perpendicular to the upper surface of the semiconductor substrate 10. Moreover, the first end side 161 is perpendicular to an extending direction of a gate trench portion to be described later. The second end side 162 is parallel to the extending direction of the gate trench portion to be described later.

The semiconductor substrate 10 is provided with an active portion 160. The active portion 160 is a region where a main current flows in the depth direction between the upper surface and a lower surface of the semiconductor substrate 10 when the semiconductor device 100 operates. An emitter electrode is provided above the active portion 160, but is omitted in FIG. 1.

In the present example, the active portion 160 is provided with a transistor portion 70 including a transistor element such as an IGBT. In another example, the transistor portion 70 and the diode portion including the diode element such as a Free Wheel Diode (FWD) may be alternately disposed along a predetermined array direction on the upper surface of the semiconductor substrate 10. The transistor portion 70 may be provided with a reverse blocking IGBT. In the present example, three transistor portions 70 (transistor portion 70-1, transistor portion 70-2, and transistor portion 70-3) are provided along the Y axis direction. A P+ type well region or gate polysilicon described later may be provided between the respective transistor portions 70.

The transistor portion 70 has the collector region of the P+ type in a region in contact with the lower surface of the semiconductor substrate 10. Further, in the transistor portion 70, an emitter region of the N+ type, a base region of the P− type, and a gate structure having a gate conductive portion and a gate dielectric film are periodically arranged on the upper surface side of the semiconductor substrate 10.

The semiconductor device 100 may have one or more pads above the semiconductor substrate 10. The semiconductor device 100 of the present example has a gate pad 164. The semiconductor device 100 may have a pad such as an anode pad, a cathode pad, and a current detection pad. Each pad is disposed in the vicinity of the first end side 161. The vicinity of the first end side 161 refers to a region between the first end side 161 and the emitter electrode in a top view. When the semiconductor device 100 is mounted, each pad may be connected to an external circuit via a wiring such as a wire.

A gate potential is applied to the gate pad 164. The gate pad 164 is electrically connected to a conductive portion of a gate trench portion of the active portion 160. The semiconductor device 100 includes a gate runner 130 that connects the gate pad 164 and the gate trench portion. In FIG. 1, the gate runner 130 is hatched with diagonal lines.

The gate runner 130 is disposed between the active portion 160 and the first end side 161 or the second end side 162 in a top view. The gate runner 130 of the present example surrounds the active portion 160 in a top view. A region surrounded by the gate runner 130 in a top view may be the active portion 160. The gate runner 130 is connected to the gate pad 164. The gate runner 130 is disposed above the semiconductor substrate 10. The gate runner 130 may be a metal wiring including aluminum or the like.

In the present example, the gate runner 130 includes a first wiring 131, a second wiring 132, and a curved portion 133. The first wiring 131 is provided between the first end side 161 and the active portion 160. The second wiring 132 is provided between the second end side 162 and the active portion 160. The curved portion 133 connects the first wiring 131 and the second wiring 132. The curved portion 133 may be provided in the vicinity of four corners of the semiconductor substrate 10. The curved portion 133 may be a portion having a curve. In the present example, the gate runner 130 includes two first wirings 131, two second wirings 132, and four curved portions 133.

A circumferential well region 11 is provided to overlap with the gate runner 130. That is, similarly to the gate runner 130, the circumferential well region 11 surrounds the active portion 160 in a top view. The circumferential well region 11 is also provided to extend with a predetermined width in a range not overlapping with the gate runner 130. The circumferential well region 11 is a region of the second conductivity type. The circumferential well region 11 of the present example is of P+ type (see FIG. 2). An impurity concentration of the circumferential well region 11 may be 5.0×1017 atoms/cm$^3$ or more and 5.0×1019 atoms/cm$^3$ or less. An impurity concentration of the circumferential well region 11 may be 2.0×1018 atoms/cm$^3$ or more and 2.0×1019 atoms/cm$^3$ or less.

Further, the semiconductor device 100 may include a temperature sensing portion (not shown) that is a PN junction diode formed of polysilicon or the like, and a current detection portion (not shown) that simulates an operation of the transistor portion 70 provided in the active portion 160. The temperature sensing portion may be connected to the anode pad and the cathode pad via wiring. When the temperature sensing portion is provided, the temperature sensing portion is preferably provided at the center of the semiconductor substrate 10 in the X axis direction and the Y axis direction.

The semiconductor device 100 of the present example includes an edge termination structure portion 90 between the active portion 160 and the first end side 161 or the second end side 162 in a top view. The edge termination structure portion 90 of the present example is disposed between the outer circumferential gate runner 130 and the first end side 161 or the second end side 162. The edge termination structure portion 90 reduces an electric field strength on the upper surface side of the semiconductor substrate 10. The edge termination structure portion 90 may include at least one of a guard ring, a field plate, and a RESURF which are annularly provided to enclose the active portion 160. The edge termination structure portion 90 will be described in detail with reference to FIG. 18.

Figure 2:
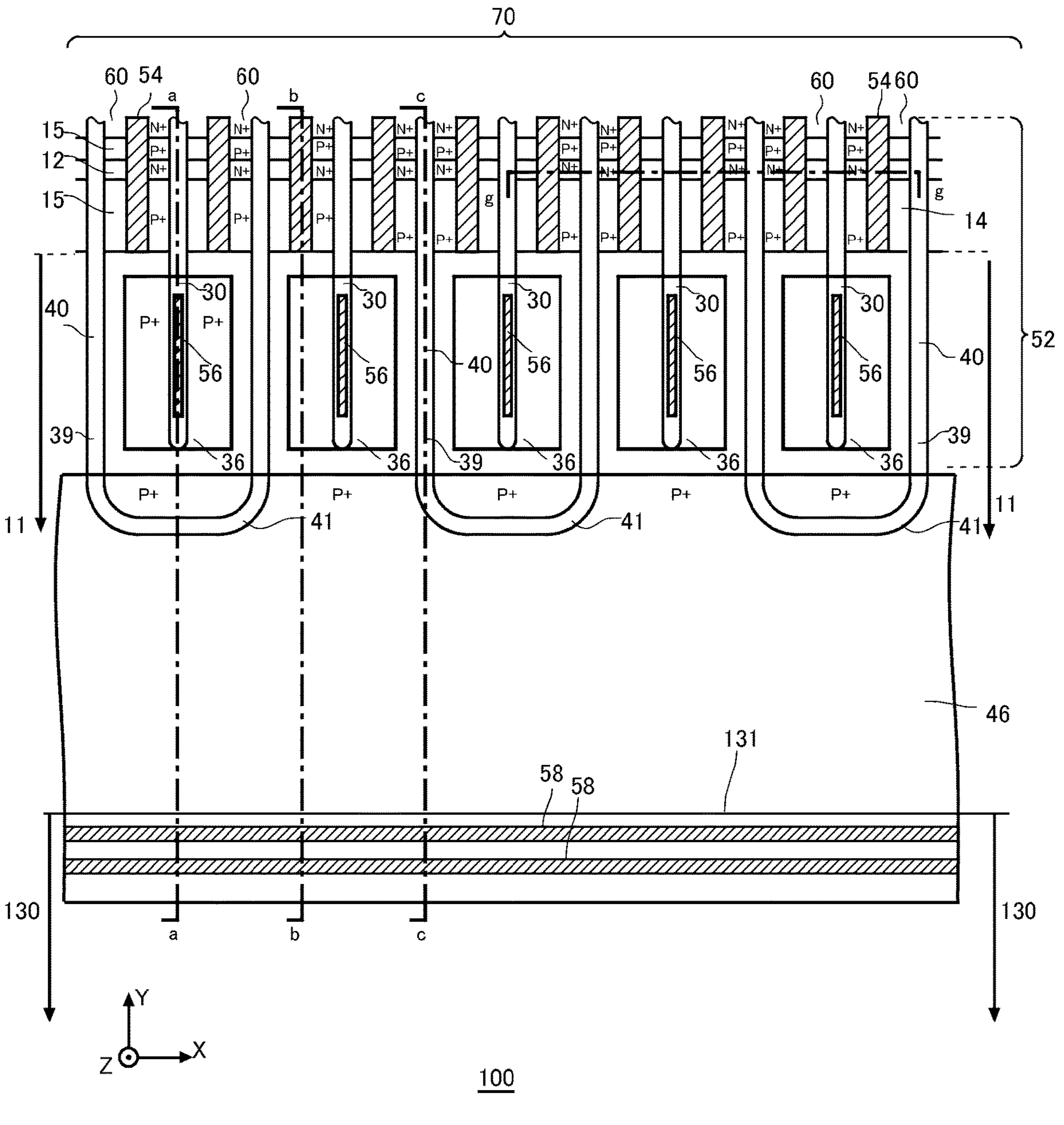
FIG. 2 is a view illustrating a comparative example of a region D in FIG. 1.

FIG. 2 is a view illustrating a comparative example of a region D in FIG. 1. FIG. 2 is an enlarged view of the region D in FIG. 1. The region D is a region including the transistor portion 70 in the vicinity of the first wiring 131 of the gate runner 130. The semiconductor device 100 of the present example includes a gate trench portion 40, a dummy trench portion 30, the circumferential well region 11, an emitter region 12, and a contact region 15 provided inside of the upper surface side of the semiconductor substrate 10. The gate trench portion 40 and the dummy trench portion 30 each are an example of the trench portion.

The semiconductor device 100 of the present example includes an emitter electrode 52 and the gate runner 130 (first wiring 131) that are provided above the upper surface of the semiconductor substrate 10. The emitter electrode 52 and the gate runner 130 are provided in isolation from each other. In addition, an interlayer dielectric film is provided between the emitter electrode 52 and the gate runner 130, and the upper surface of the semiconductor substrate 10. In FIG. 2, the interlayer dielectric film is omitted.

The emitter electrode 52 is provided above the gate trench portion 40, the dummy trench portion 30, the circumferential well region 11, the emitter region 12, and the contact region 15. The emitter electrode 52 is in contact with the emitter region 12 and the contact region 15 on the upper surface of the semiconductor substrate 10 through a contact hole 54. Further, the emitter electrode 52 is connected to a dummy conductive portion in the dummy trench portion 30 through a contact hole 56 provided in the interlayer dielectric film. In the present example, the emitter electrode 52 is connected to the dummy conductive portion in the dummy trench portion 30 via a dummy polysilicon 36. The emitter electrode 52 may be connected to the dummy conductive portion of the dummy trench portion 30 at an edge of the dummy trench portion 30 in the Y axis direction. The dummy polysilicon 36 is formed of polysilicon as a conductive material. The dummy polysilicon 36 may be provided above the semiconductor substrate 10.

The gate runner 130 is connected to the gate polysilicon 46 through a contact hole 58 provided in the interlayer dielectric film. The gate polysilicon 46 is connected to the gate trench portion 40. That is, the gate runner 130 is connected to the gate trench portion 40 via the gate polysilicon 46. The gate runner 130 may be connected to a gate conductive portion of the gate trench portion 40 at an edge portion 41 of the gate trench portion 40 in the Y axis direction. The gate runner 130 is not connected to the dummy conductive portion in the dummy trench portion 30.

The gate polysilicon 46 is formed of polysilicon as a conductive material. The gate polysilicon 46 may be provided above the semiconductor substrate 10. The gate polysilicon 46 is provided along the extending direction (X axis direction) of the gate runner 130. The gate polysilicon 46 is provided along an end side (the first end side 161 in FIG. 1). In the comparative example, the gate polysilicon 46 is continuously provided in the X axis direction.

The emitter electrode 52 is formed of a material containing metal. For example, at least a part of a region of the emitter electrode 52 is formed of aluminum or an aluminum-silicon alloy, for example, a metal alloy such as AlSi or AlSiCu. The emitter electrode 52 may have a barrier metal formed of titanium, a titanium compound, or the like in the lower layer of the region formed of aluminum or the like. Further, in the contact hole, a plug formed with tungsten or the like buried therein may be included to be in contact with the barrier metal, aluminum, or the like.

The transistor portion 70 has a plurality of trench portions arranged in the array direction. In the present example, the trench portion is provided in the active portion 160 and the circumferential well region 11 on the upper surface of the semiconductor substrate 10. The trench portion is provided in a striped pattern in a top view in the transistor portion 70. In the transistor portion 70, one or more gate trench portions 40 and one or more dummy trench portions 30 are alternately provided along the array direction. In the present example, one gate trench portion 40 and one dummy trench portion 30 are alternately provided. In FIG. 2, the array direction is the X axis direction.

The gate trench portion 40 of the present example may have two linear portions 39 extending along the extending direction perpendicular to the array direction (portions of a trench that are linear along the extending direction), and the edge portion 41 connecting the two linear portions 39. The extending direction in FIG. 2 is the Y axis direction.

At least a part of the edge portion 41 is desirably provided in a curved shape in a top view. By connecting between end portions of the two linear portions 39 in the Y axis direction by the edge portion 41, it is possible to reduce the electric field strength at the end portions of the linear portions 39.

In the transistor portion 70, the dummy trench portions 30 are provided between the respective linear portions 39 of the gate trench portions 40. Between the respective linear portions 39, one dummy trench portion 30 may be provided, or a plurality of dummy trench portions 30 may be provided. In the present example, one dummy trench portion 30 are provided between the respective linear portions 39.

A diffusion depth of the circumferential well region 11 may be deeper than depths of the gate trench portion 40 and the dummy trench portion 30. The ends of the gate trench portion 40 and the dummy trench portion 30 in the Y axis direction are provided in the circumferential well region 11 in a top view. That is, at the end of each trench portion in the Y axis direction, a bottom of each trench portion in the depth direction is covered with the circumferential well region 11. With this configuration, the electric field strength on the bottom of each trench portion can be reduced. The semiconductor device 100 may include the gate trench portion 40 or the dummy trench portion 30 provided entirely in the circumferential well region 11 in a top view.

A mesa portion is provided between the respective trench portions in the array direction. The mesa portion refers to a region sandwiched between the trench portions inside the semiconductor substrate 10. As an example, an upper end of the mesa portion is the upper surface of the semiconductor substrate 10. The depth position of the lower end of the mesa portion is the same as the depth position of the lower end of the trench portion. The mesa portion of the present example is provided extending in the extending direction (the Y axis direction) along the trench, on the upper surface of the semiconductor substrate 10. In the present example, a mesa portion 60 is provided in the transistor portion 70.

Each mesa portion 60 may be provided with at least one of a first conductivity type emitter region 12 or a second conductivity type contact region 15. The emitter region 12 of the present example is an N+ type, and the contact region 15 is a P+ type. The emitter region 12 and the contact region 15 may be provided between the base region and the upper surface of the semiconductor substrate 10 in the depth direction.

The mesa portion 60 of the transistor portion 70 includes the emitter region 12 exposed to the upper surface of the semiconductor substrate 10. The emitter region 12 is provided in contact with the gate trench portion 40. The mesa portion 60 in contact with the gate trench portion 40 may be provided with the contact region 15 exposed on the upper surface of the semiconductor substrate 10. In the present example, the region in the mesa portion 60 that is exposed on the upper surface of the semiconductor substrate 10 and disposed closest in proximity to the gate runner 130 is the contact region 15.

Each of the contact region 15 and the emitter region 12 in the mesa portion 60 is provided from one trench portion to the other trench portion in the X axis direction. By way of example, the contact region 15 and the emitter region 12 of the mesa portion 60 are alternately arranged along the extending direction (Y axis direction) of the trench portion.

In another example, the contact region 15 and the emitter region 12 of the mesa portion 60 may be provided in a stripe shape along the extending direction (Y axis direction) of the trench portion. For example, the emitter region 12 is provided in a region in contact with the trench portion, and the contact region 15 is provided in a region sandwiched between the emitter regions 12.

Figure 3:
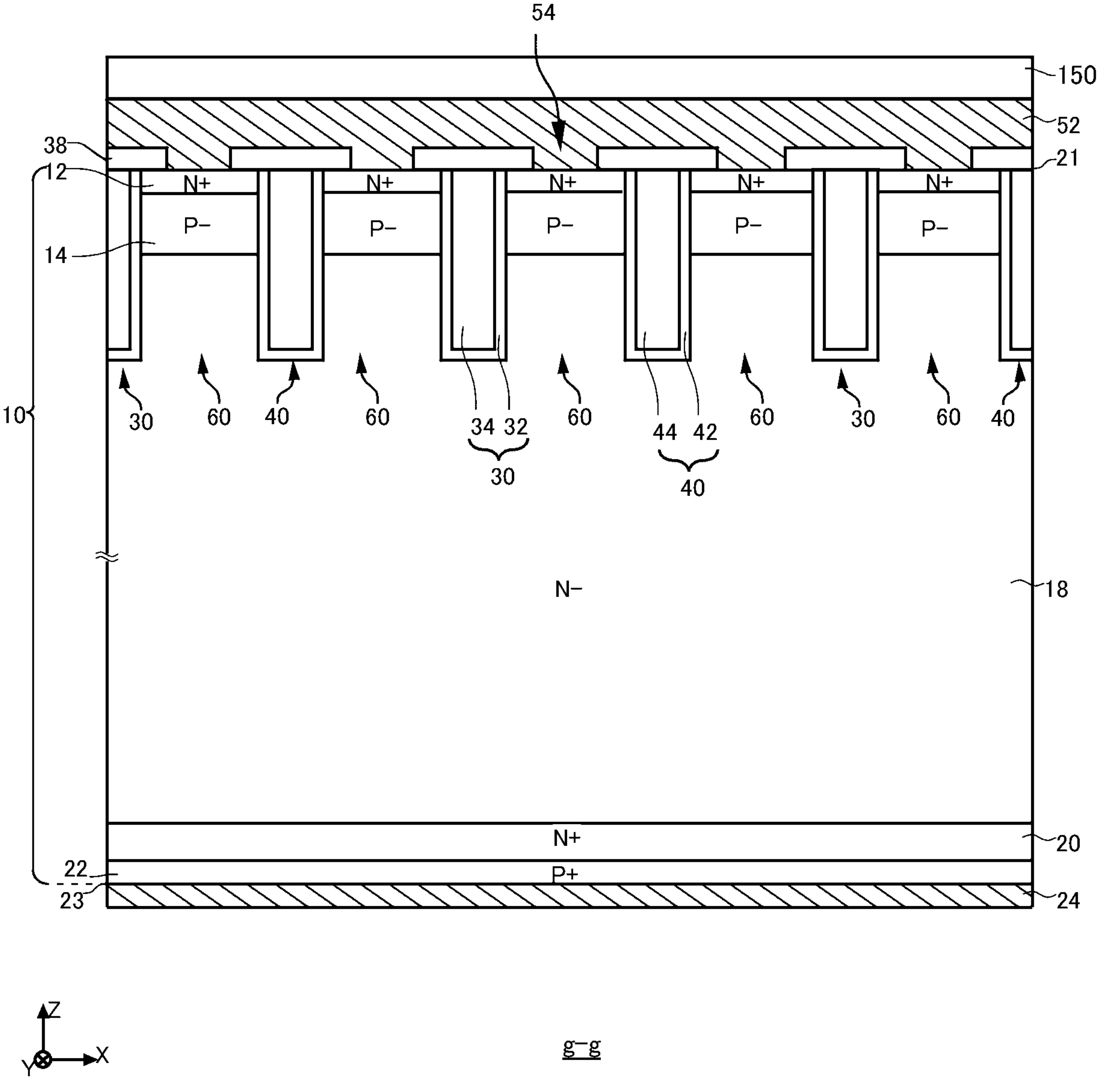
FIG. 3 is a view illustrating an example of a g-g cross section in FIG. 2.

FIG. 3 is a view illustrating an example of a g-g cross section in FIG. 2. The g-g cross section is an XZ plane passing through the emitter region 12. Note that the dimensions in FIG. 3 do not necessarily match the dimensions in FIG. 2. The semiconductor device 100 of the present example has the semiconductor substrate 10, an interlayer dielectric film 38, the emitter electrode 52, and a collector electrode 24, and a protective film 150 in the cross section.

The interlayer dielectric film 38 is provided in an upper surface 21 of the semiconductor substrate 10. The interlayer dielectric film 38 is a film including at least one layer of a dielectric film such as silicate glass to which an impurity such as boron or phosphorous is added, a thermal oxide film, and other dielectric films. The interlayer dielectric film 38 is provided with the contact hole 54 described in FIG. 2.

The emitter electrode 52 is provided above the interlayer dielectric film 38. The emitter electrode 52 is in contact with an upper surface 21 of the semiconductor substrate 10 through the contact hole 54 of the interlayer dielectric film 38. Note that the emitter electrode 52 may be provided above the circumferential well region 11. The gate runner 130 may be provided above the circumferential well region 11. In the present example, the gate polysilicon 46 is provided below the gate runner 130.

The collector electrode 24 is provided on the lower surface, 23, of the semiconductor substrate 10. The emitter electrode 52 and the collector electrode 24 are formed of a metal material such as aluminum. In the specification, the direction in which the emitter electrode 52 is connected to the collector electrode 24 (the Z axis direction) is referred to as a depth direction.

Each mesa portion 60 is provided with a second conductivity type base region 14. The emitter region 12 and the contact region 15 are provided between the upper surface 21 of the semiconductor substrate 10 and the base region 14. The base region 14 of the present example is of P− type.

The semiconductor substrate 10 includes a drift region 18 of the first conductivity type. The drift region 18 of the present example is of N− type.

In the mesa portion 60, the emitter region 12 of N+ type and the base region 14 of P− type are provided in order from the upper surface 21 side of the semiconductor substrate 10. The drift region 18 is provided below the base region 14. The mesa portion 60 may also be provided with an N+ type accumulation region (not shown).

The emitter region 12 is exposed on the upper surface 21 of the semiconductor substrate 10 and is provided in contact with gate trench portion 40. The emitter region 12 may be in contact with the trench portions on both sides of the mesa portion 60. The emitter region 12 has a higher doping concentration than the drift region 18.

The base region 14 is provided below the emitter region 12. The base region 14 of the present example is provided in contact with the emitter region 12. The base region 14 may be in contact with the trench portions on both sides of the mesa portion 60. As an example, a peak value of an impurity concentration of the base region 14 is $2.5\times10^{17}$ atoms/cm$^3$. The impurity concentration of the base region 14 may be $5.0\times10^{16}$ atoms/cm$^3$ or more and $1.0\times10^{18}$ atoms/cm$^3$ or less.

In addition, in another cross section, the contact region 15 of P+ type and the base region 14 of P− type are provided in the mesa portion 60 in order from the upper surface 21 side of the semiconductor substrate 10. The drift region 18 is provided below the base region 14.

An N+ type buffer region 20 may be provided below the drift region 18. The doping concentration of the buffer region 20 is higher than the doping concentration of the drift region 18. The buffer region 20 may have a concentration peak having a higher doping concentration than the doping concentration of the drift region 18. The doping concentration of the concentration peak indicates a doping concentration at the local maximum of the concentration peak. Further, as the doping concentration of the drift region 18, an average value of doping concentrations in the region where the doping concentration distribution is substantially flat may be used.

The buffer region 20 may be formed by ion implantation of the dopant of the N type such as hydrogen (proton) or phosphorus. The buffer region 20 of the present example is formed by the ion implantation of hydrogen. The buffer region 20 may serve as a field stop layer to prevent a depletion layer extending from the lower end of the base region 14 from reaching a P+ type collector region 22.

The P+ type collector region 22 is provided below the buffer region 20. An acceptor concentration of the collector region 22 is higher than an acceptor concentration of the base region 14. The collector region 22 may include an acceptor which is the same as or different from an acceptor of the base region 14. The acceptor of the collector region 22 is, for example, boron. The element serving as the acceptor is not limited to the example described above.

The collector region 22 is exposed on the lower surface 23 of the semiconductor substrate 10 and connected to the collector electrode 24. The collector electrode 24 may be in contact with the entire lower surface 23 of the semiconductor substrate 10. The emitter electrode 52 and the collector electrode 24 are formed of a metal material such as aluminum.

One or more gate trench portions 40 and one or more dummy trench portions 30 are provided on the upper surface 21 side of the semiconductor substrate 10. In the present example, a plurality of gate trench portions 40 and a plurality of dummy trench portions 30 are provided on the upper surface 21 side of the semiconductor substrate 10. Each of the trench portions penetrates the base region 14 from the upper surface 21 of the semiconductor substrate 10 and reaches the drift region 18. In a region where at least any one of the emitter region 12 and the contact region 15 is provided, each trench portion also penetrates the doping regions of these to reach the drift region 18. The configuration of the trench portion penetrating the doping region is not limited to that manufactured in the order of forming the doping region and then forming the trench portion. The configuration of the trench portion penetrating the doping region includes a configuration of the doping region being formed between the trench portions after forming the trench portions.

The gate trench portion 40 includes a gate trench provided in the upper surface 21 of the semiconductor substrate 10, a gate dielectric film 42, and a gate conductive portion 44. The gate conductive portion 44 is formed of polysilicon as a conductive material. The gate conductive portion 44 may be formed of the same material as the gate polysilicon 46. The gate dielectric film 42 is provided covering an inner wall of the gate trench. The gate dielectric film 42 may be formed by oxidizing or nitriding a semiconductor on the inner wall of the gate trench. In FIG. 3, the gate conductive portion 44 is provided inside the gate dielectric film 42 in the gate trench. That is, the gate dielectric film 42 insulates the gate conductive portion 44 from the semiconductor substrate 10.

The gate conductive portion 44 in the gate trench portion 40 may be provided longer than the base region 14 in the depth direction. The gate trench portion 40 in the cross section is covered by the interlayer dielectric film 38 on the upper surface 21 of the semiconductor substrate 10. The gate conductive portion 44 is electrically connected to the gate runner 130. When a predetermined gate voltage is applied to the gate conductive portion 44, a channel is formed by an electron inversion layer in a surface layer of the base region 14 at a boundary in contact with the gate trench portion 40.

The dummy trench portions 30 may have the same structure as the gate trench portions 40 in the cross section. The dummy trench portion 30 includes a dummy trench provided in the upper surface 21 of the semiconductor substrate 10, a dummy dielectric film 32, and a dummy conductive portion 34. The dummy conductive portion 34 is formed of polysilicon as a conductive material. The dummy conductive portion 34 may be formed of the same material as the dummy polysilicon 36. The dummy conductive portion 34 is electrically connected to the emitter electrode 52. The dummy dielectric film 32 is provided covering an inner wall of the dummy trench. In FIG. 3, the dummy conductive portion 34 is provided in the dummy trench and is provided inside the dummy dielectric film 32. The dummy dielectric film 32 insulates the dummy conductive portion 34 from the semiconductor substrate 10. The dummy conductive portion 34 may have the same length as the gate conductive portion 44 in the depth direction.

The gate trench portion 40 and the dummy trench portion 30 of the present example are covered with the interlayer dielectric film 38 on the upper surface 21 of the semiconductor substrate 10. It is noted that the bottoms of the dummy trench portion 30 and the gate trench portion 40 may be formed in a curved-surface shape (a curved-line shape in the cross section) convexly downward.

The protective film 150 is provided on the upper surface of the emitter electrode 52. By providing the protective film 150 on the upper surface of the emitter electrode 52, the electrode can be protected. The protective film 150 may be provided by being patterned. As an example, the protective film 150 is a polyimide film.

Figure 4:
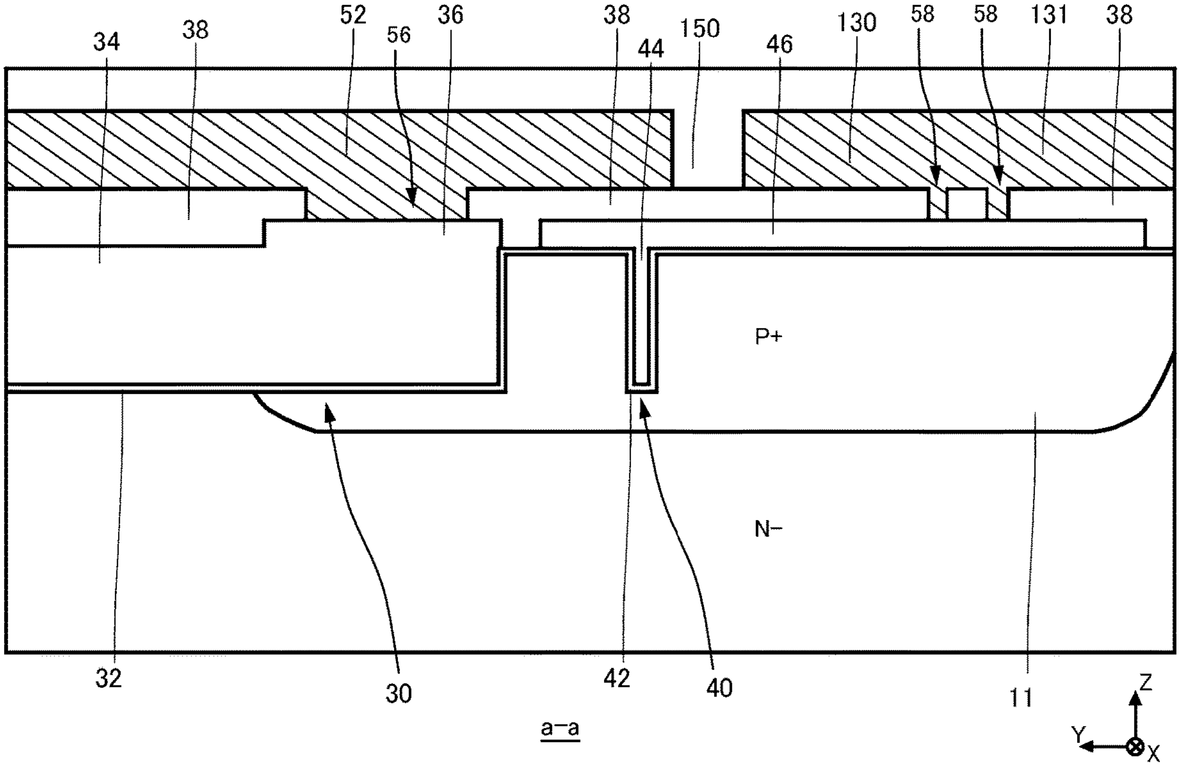
FIG. 4 is a view illustrating an example of an a-a cross section in FIG. 2.

FIG. 4 is a view illustrating an example of an a-a cross section in FIG. 2. The a-a cross section is a YZ plane passing through the contact hole 56. Note that the dimensions in FIG. 4 do not necessarily match the dimensions in FIG. 2. The semiconductor device 100 of the present example has the semiconductor substrate 10, the interlayer dielectric film 38, the emitter electrode 52, and the collector electrode 24, and the protective film 150 in the cross section. Note that in FIG. 4, the illustration of the vicinity of the lower surface 23 of the semiconductor substrate 10 is omitted. In the cross section, the dummy conductive portion 34 in the dummy trench portion 30 is connected to the emitter electrode 52 via the contact hole 56. Further, the gate runner 130 is connected to the gate conductive portion 44.

Figure 5:
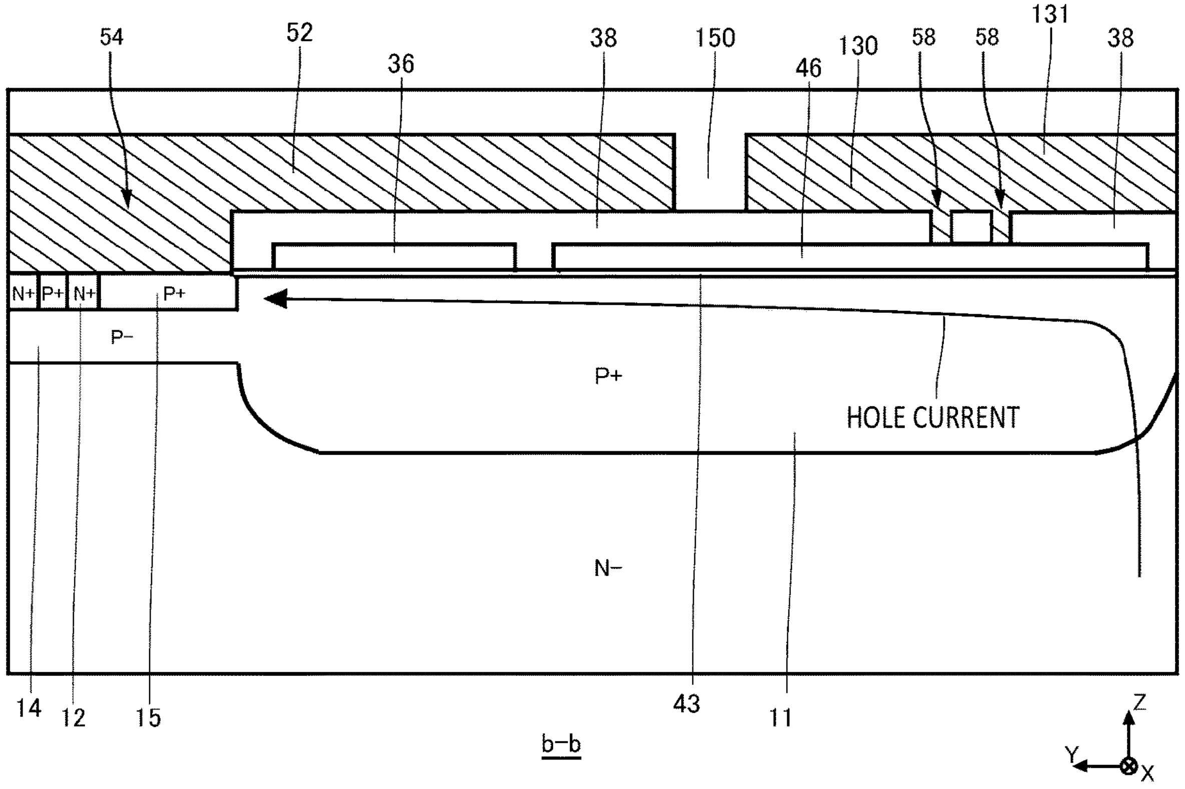
FIG. 5 is a view illustrating an example of a b-b cross section in FIG. 2.

FIG. 5 is a view illustrating an example of a b-b cross section in FIG. 2. The b-b cross section is a YZ plane passing through the contact hole 54. Note that the dimensions in FIG. 5 do not necessarily match the dimensions in FIG. 2. The semiconductor device 100 of the present example has the semiconductor substrate 10, the interlayer dielectric film 38, the emitter electrode 52, and the collector electrode 24, and the protective film 150 in the cross section. Note that in FIG. 5, the illustration of the vicinity of the lower surface 23 of the semiconductor substrate 10 is omitted. In the cross section, the upper surface 21 of the semiconductor substrate 10 is connected to the emitter electrode 52 via the contact hole 54.

Figure 6:
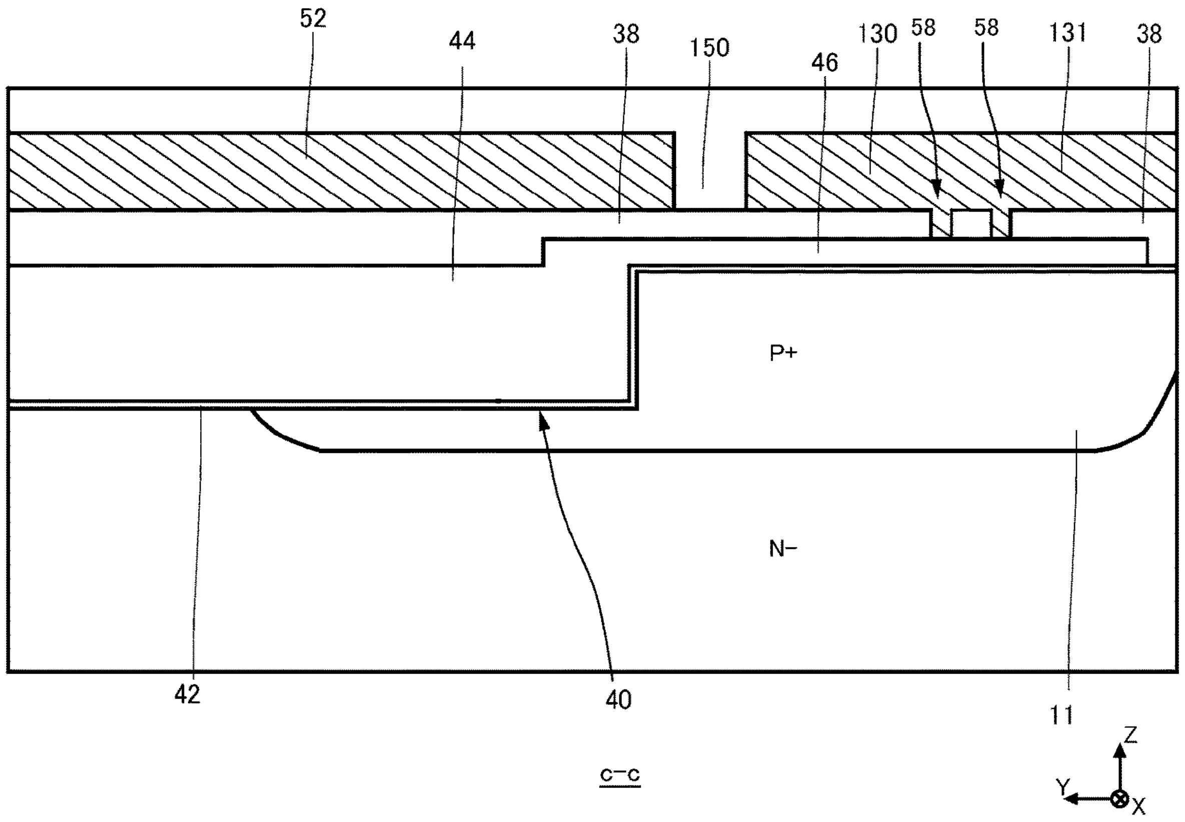
FIG. 6 is a view illustrating an example of a c-c cross section in FIG. 2.

FIG. 6 is a view illustrating an example of a c-c cross section in FIG. 2. The c-c cross section is a YZ plane passing through the linear portion 39 of the gate trench portion 40. Note that the dimensions in FIG. 6 do not necessarily match the dimensions in FIG. 2. The semiconductor device 100 of the present example has the semiconductor substrate 10, the interlayer dielectric film 38, the emitter electrode 52, and the collector electrode 24, and the protective film 150 in the cross section. Note that in FIG. 6, the illustration of the vicinity of the lower surface 23 of the semiconductor substrate 10 is omitted. In the cross section, the gate runner 130 is connected to the gate conductive portion 44.

In FIG. 5, a thin dielectric film 43 is provided between the gate polysilicon 46 and the circumferential well region 11. The dielectric film 43 is provided when the gate dielectric film 42 and the dummy dielectric film 32 are formed. At the time of turn-off of the semiconductor device 100 or the like, a hole current flowing out from the edge termination structure portion 90 to the emitter electrode 52 is generated. The potential of the circumferential well region 11 rises due to the hole current, and a potential difference is generated between the gate polysilicon 46 and the circumferential well region 11. When the thin dielectric film 43 exists between the gate polysilicon 46 and the circumferential well region 11, the dielectric film 43 may be broken due to the potential difference. For example, when the potential difference exceeds 80 V, there is a possibility that the dielectric film 43 between the gate polysilicon 46 and the circumferential well region 11 undergoes dielectric breakdown, which causes a chip defect.

Figure 7:
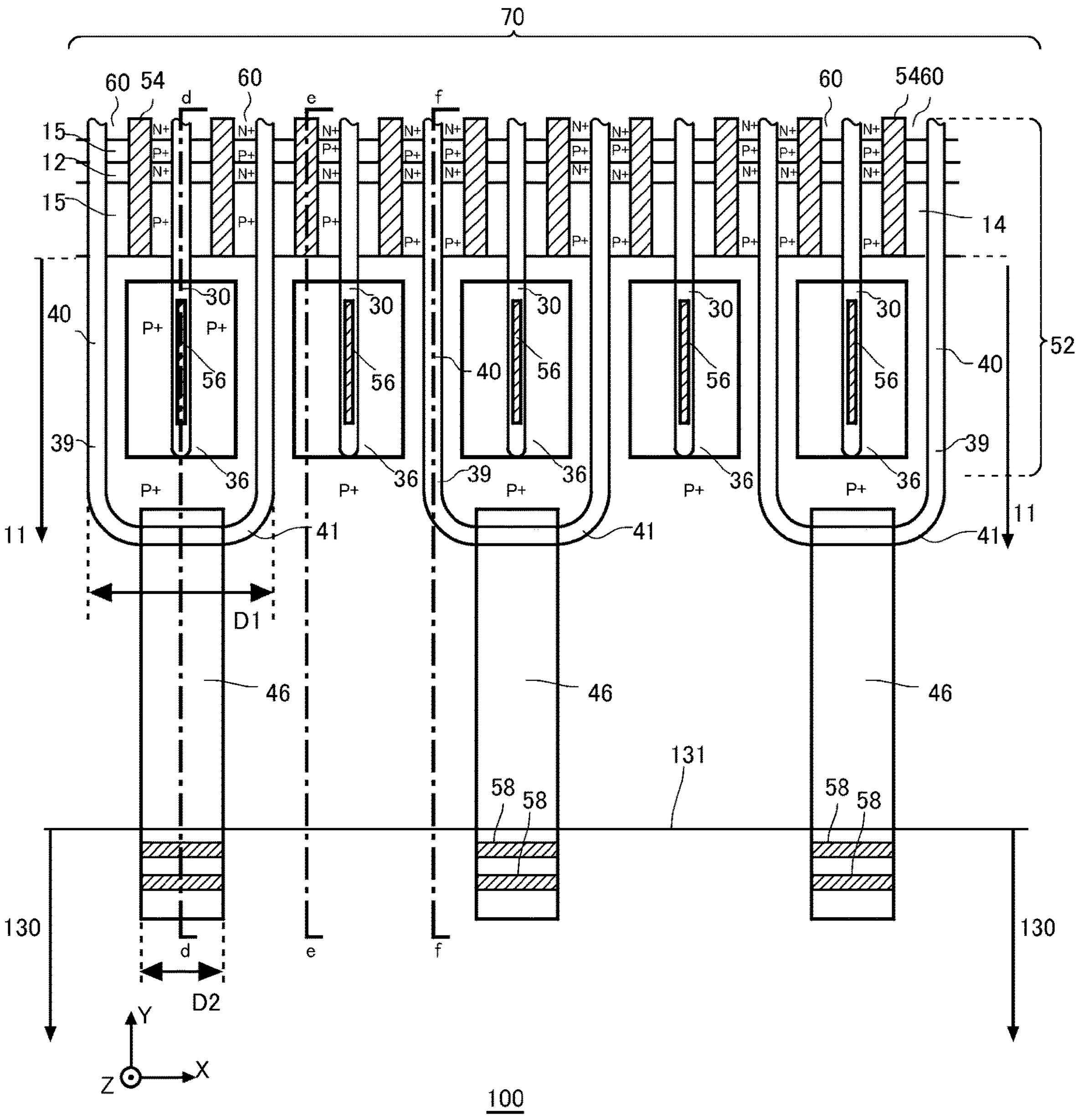
FIG. 7 is a view illustrating an example of an embodiment of the region D in FIG. 1.

FIG. 7 is a view illustrating an example of an embodiment of the region D in FIG. 1. FIG. 7 is an enlarged view of the region D in FIG. 1. The semiconductor device 100 of FIG. 7 is different from the semiconductor device 100 of FIG. 2 in the configuration of the gate polysilicon 46. Other configurations of the semiconductor device 100 in FIG. 7 may be the same as those of the semiconductor device 100 in FIG. 2.

In FIG. 7, a plurality of the gate polysilicon 46 is provided. The plurality of gate polysilicon 46 is provided along the extending direction (X axis direction) of the gate runner 130. The gate polysilicon 46 is discretely provided along the extending direction of the gate runner 130. The plurality of gate polysilicon 46 is provided along the end side (the first end side 161 in FIG. 1). By providing the plurality of gate polysilicon 46, an area in which the gate polysilicon 46 is provided in a top view can be reduced.

In addition, the plurality of gate polysilicon 46 connects the plurality of gate trench portions 40 to the gate runner 130, respectively. In the present example, at least one gate trench portion 40 among the plurality of gate trench portions 40 is connected to one gate polysilicon 46 among the plurality of gate polysilicon 46. That is, one gate trench portion 40 is connected to one gate polysilicon 46. In the present example, one gate trench portion 40 is connected to one gate polysilicon 46 at the edge portion 41. With such a configuration, even when the gate polysilicon 46 is discretely provided, the gate conductive portion 44 and the gate runner 130 can be electrically connected.

In the present example, a width D1 of the gate trench portion 40 including two linear portions 39 in the array direction may be larger than a width D2 of the gate polysilicon 46 connected to the gate trench portion 40 in the array direction. With such a configuration, the gate polysilicon 46 can be provided only in a region overlapping the gate trench portion 40 in the array direction, and the area in which the gate polysilicon 46 is provided in a top view can be reduced.

In order to increase a contact area between the gate trench portion 40 and the gate polysilicon 46, the width D2 is preferably large. The width D2 may be 50% or more of the width D1. The width D2 may be 80% or more of the width D1.

In addition, in the present example, the gate polysilicon 46 has a long side in a direction from the gate runner 130 toward the gate trench portion 40. The gate polysilicon 46 has a long side in the extending direction of the gate trench portion 40. In the present example, the gate polysilicon 46 has a long side in the Y axis direction.

Figure 8:
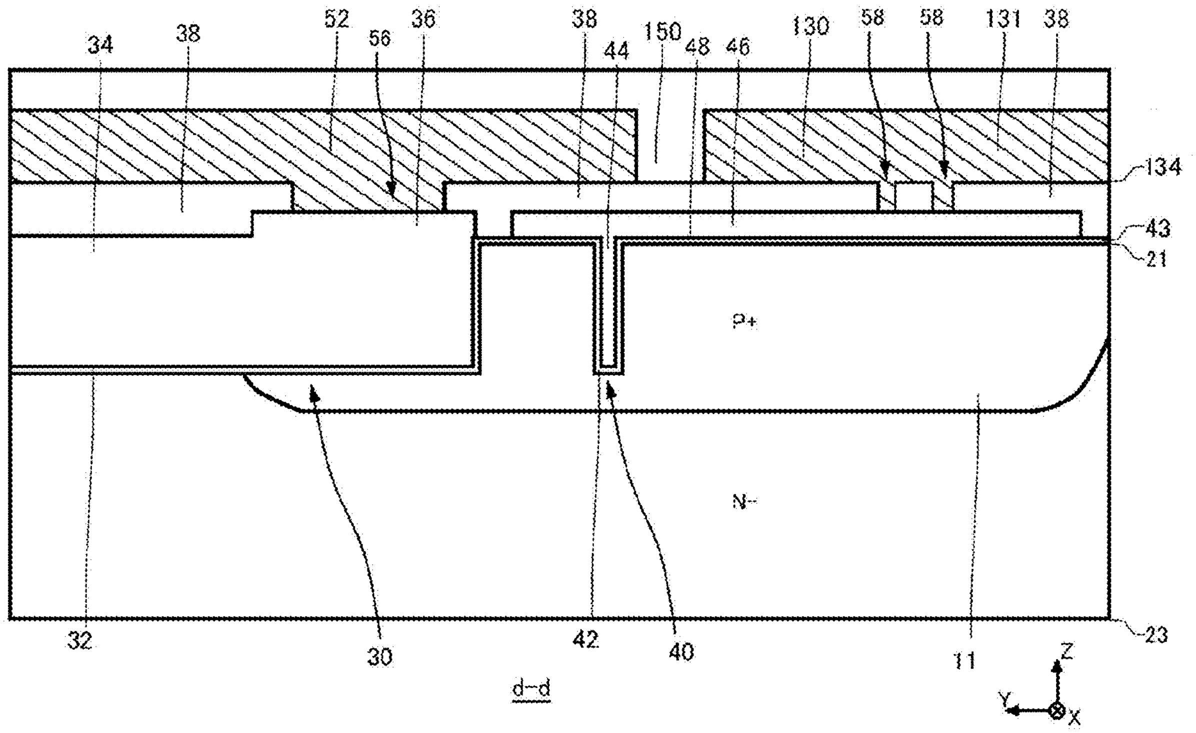
FIG. 8 is a view illustrating an example of a d-d cross section in FIG. 7.

FIG. 8 is a view illustrating an example of a d-d cross section in FIG. 7. The d-d cross section is a YZ plane passing through the contact hole 56. In the cross section, the gate polysilicon 46 is provided below the first wiring 131 of the gate runner 130, which is the same as FIG. 4. Therefore, in the cross section, the gate runner 130 is connected to the gate conductive portion 44.

As can be seen in FIG. 8, a lower surface 134 of the gate runner 130 is farther from the upper surface 21 of the semiconductor substrate 10 than a lower surface 48 of each of the plurality of the gate polysilicon 46 in a depth direction of the semiconductor substrate 10, over a whole of the upper surface 21 of the semiconductor substrate 10.

Figure 9:
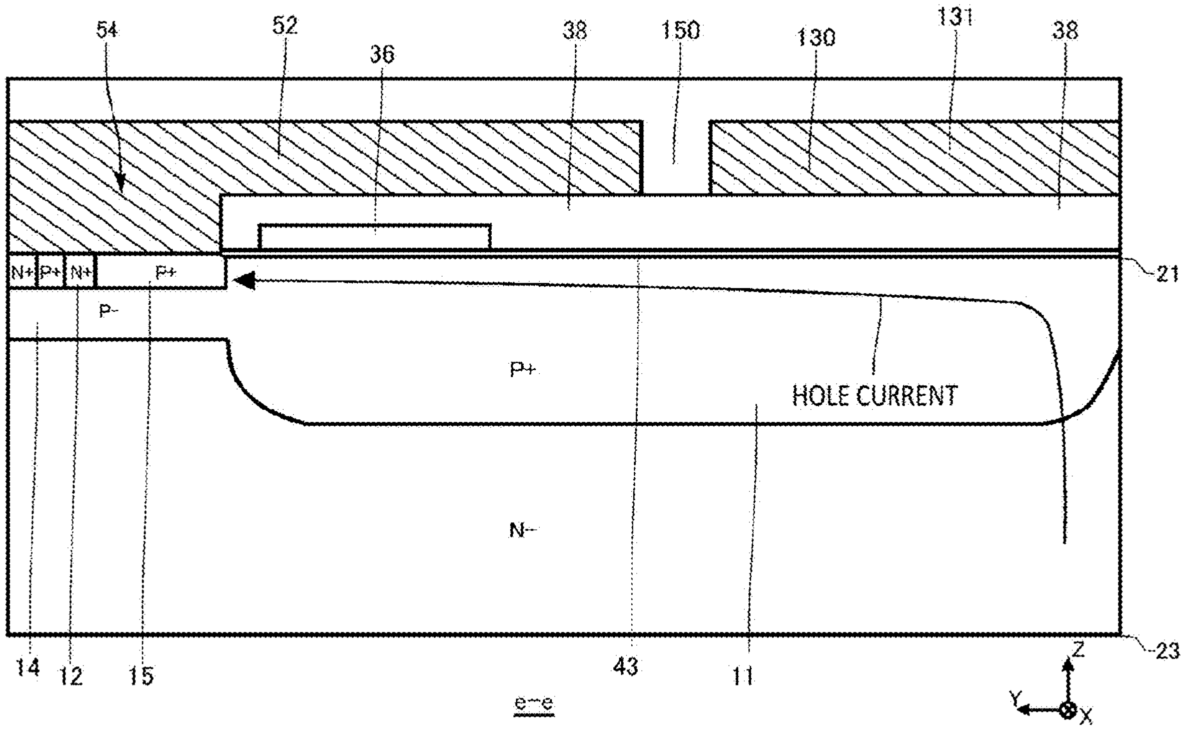
FIG. 9 is a view illustrating an example of an e-e cross section in FIG. 7.

FIG. 9 is a view illustrating an example of an e-e cross section in FIG. 7. The e-e cross section is a YZ plane passing through the contact hole 54. The cross section of FIG. 9 is different from the cross section of FIG. 5 in that the gate polysilicon 46 is not provided. Other configurations of the cross section of FIG. 9 may be the same as those of FIG. 5.

As described with reference to FIG. 7, in the present example, the area in which the gate polysilicon 46 is provided in a top view is reduced. Since the gate polysilicon 46 is not provided in the cross section of FIG. 9, the interlayer dielectric film 38 thicker than the dielectric film 43 is provided between the gate runner 130 and the circumferential well region 11. Therefore, even when the potential of the circumferential well region 11 rises due to the hole current, it is possible to suppress the breakdown of the dielectric film between the gate runner 130 and the circumferential well region 11.

Figure 10:
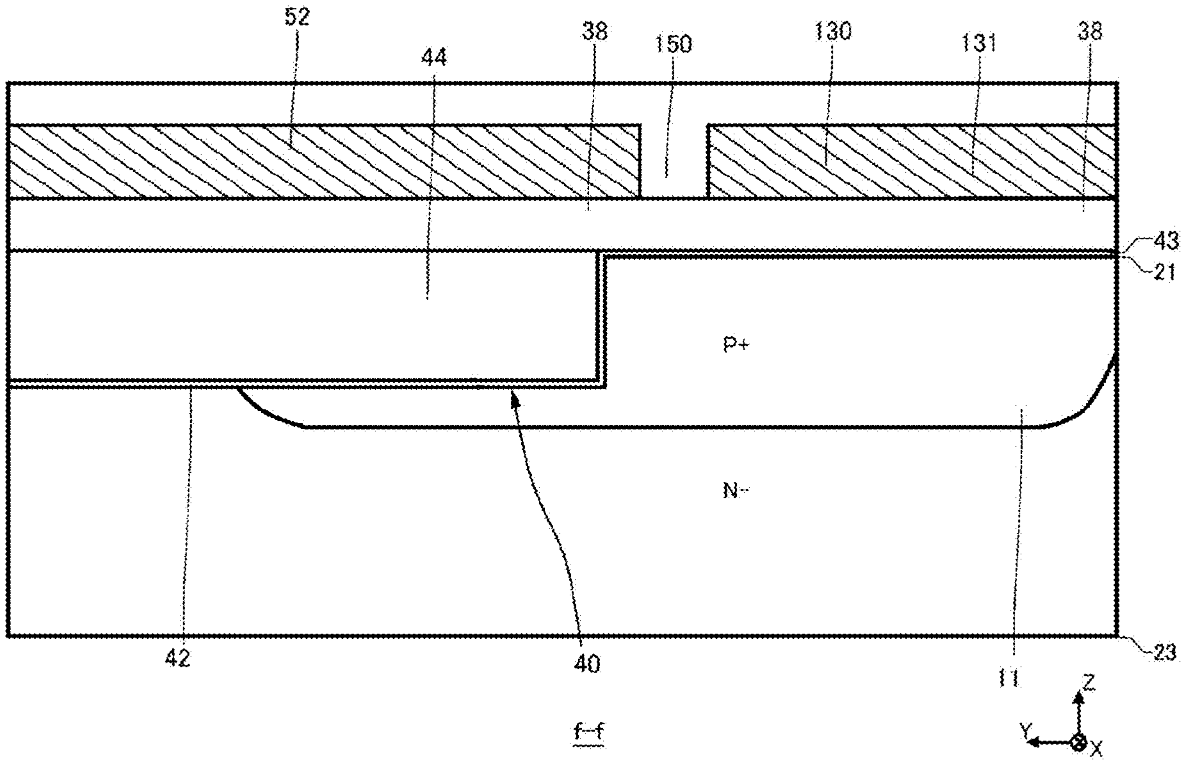
FIG. 10 is a view illustrating an example of an f-f cross section in FIG. 7.

FIG. 10 is a view illustrating an example of an f-f cross section in FIG. 7. The f-f cross section is a YZ plane passing through the linear portion 39 of the gate trench portion 40. The cross section of FIG. 10 is different from the cross section of FIG. 6 in that the gate polysilicon 46 is not provided. Other configurations of the cross section of FIG. 10 may be the same as those of FIG. 6. Since the gate polysilicon 46 is not provided in the cross section, the gate runner 130 is not connected to the gate conductive portion 44.

Figure 11:
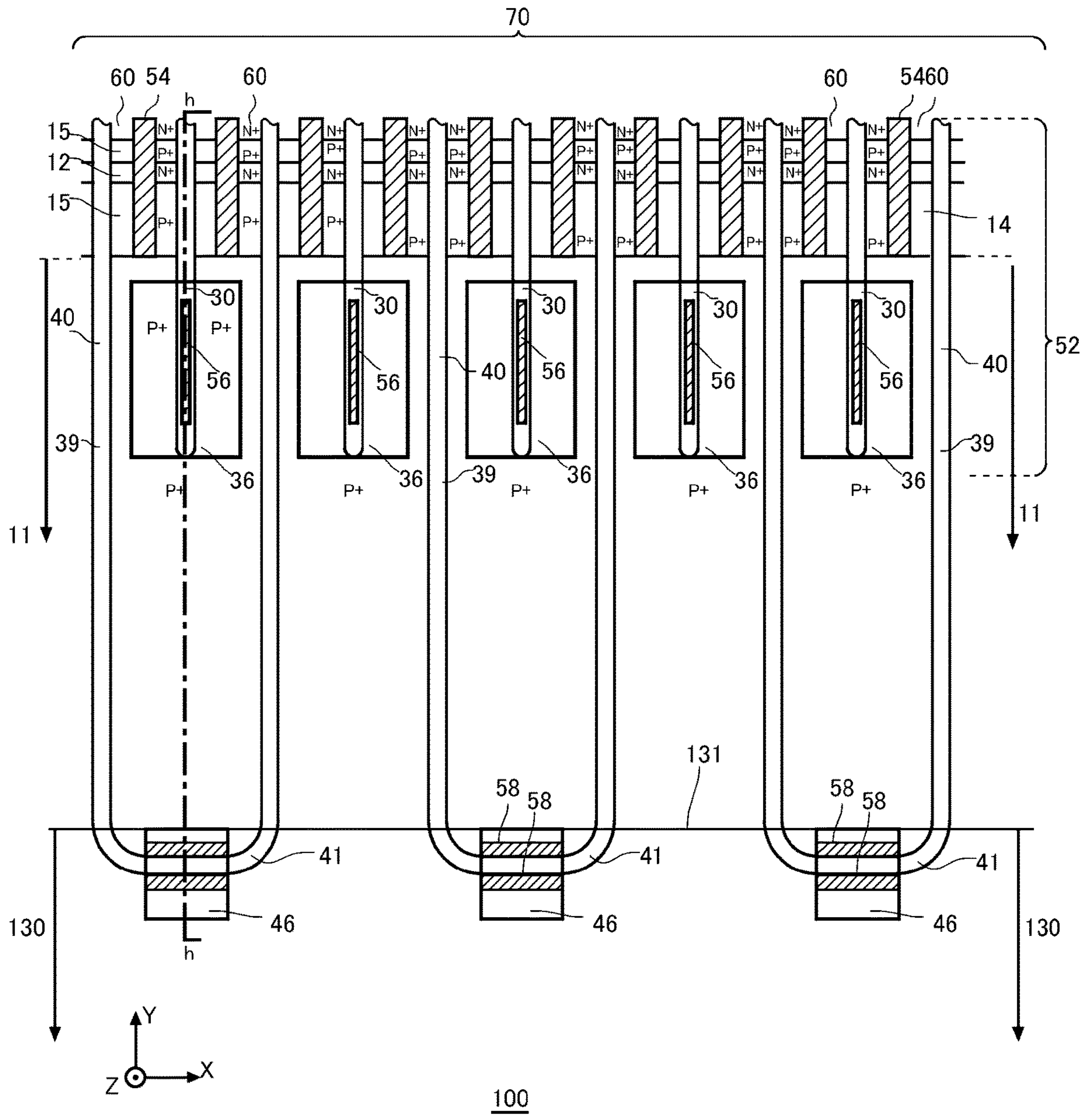
FIG. 11 is a view illustrating another example of the embodiment of the region D in FIG. 1.

FIG. 11 is a view illustrating another example of the embodiment of the region D in FIG. 1. FIG. 11 is an enlarged view of the region D in FIG. 1. The semiconductor device 100 in FIG. 11 is different from the semiconductor device 100 in FIG. 7 in the configurations of the gate polysilicon 46 and the gate trench portion 40. Other configurations of the semiconductor device 100 in FIG. 11 may be the same as those of the semiconductor device 100 in FIG. 7.

In the present example, at least a part of the gate trench portion 40 is provided to extend to the gate runner 130. In addition, at least a part of the gate trench portion 40 is provided to extend to the lower side of the gate runner 130. In FIG. 11, the edge portion 41 of the gate trench portion 40 overlaps the gate runner 130 in a top view. By providing at least a part of the gate trench portion 40 up to the gate runner 130, the area in which the gate polysilicon 46 is provided in a top view can be further reduced. Therefore, it is possible to increase an region where a thick dielectric film is provided between the gate runner 130 and the circumferential well region 11 as in the cross section of FIG. 9, and it is possible to suppress the breakdown of the dielectric film at the time of turn-off.

Figure 12:
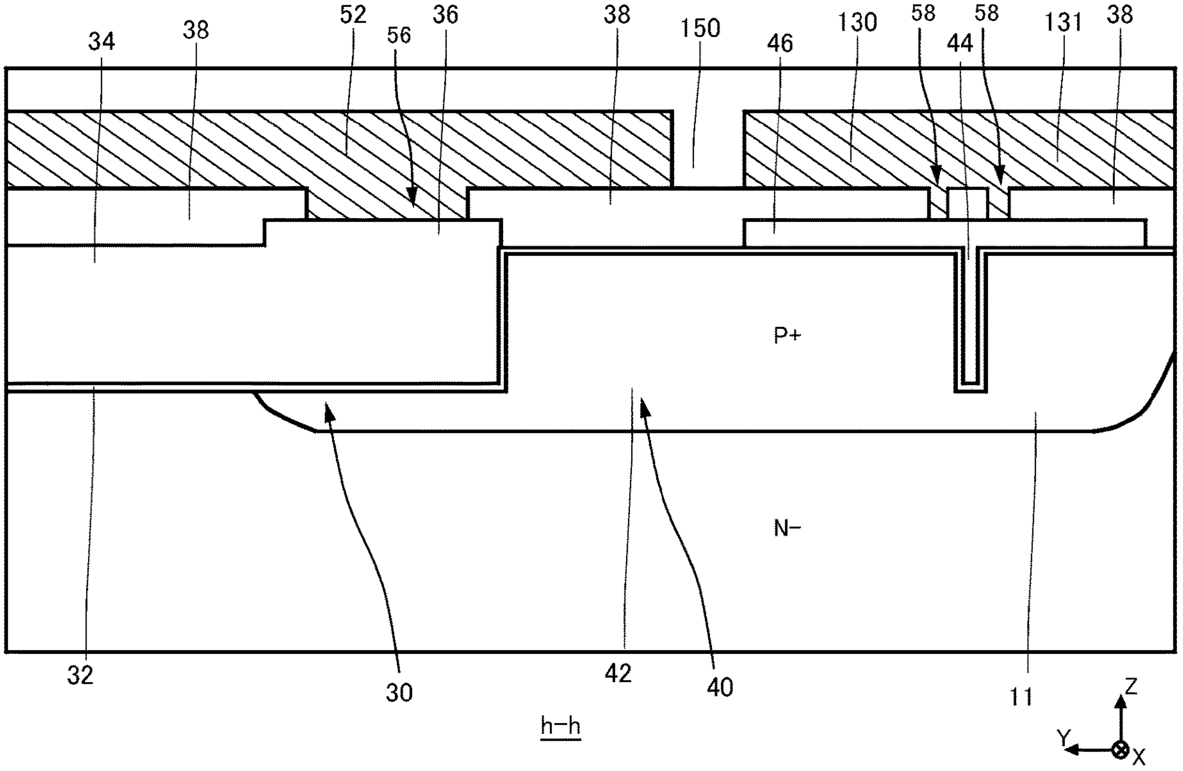
FIG. 12 is a view illustrating an example of an h-h cross section in FIG. 11.

FIG. 12 is a view illustrating an example of an h-h cross section in FIG. 11. The h-h cross section is a YZ plane passing through the contact hole 56. The cross section of FIG. 12 is different from the cross section of FIG. 8 in the configurations of the gate polysilicon 46 and the gate trench portion 40. Other configurations of the cross section of FIG. 12 may be the same as those of the cross section of FIG. 8.

In the present example, the gate polysilicon 46 is provided between the gate trench portion 40 and the gate runner 130 in the depth direction. With such a configuration, the area in which the gate polysilicon 46 is provided in a top view can be further reduced. In addition, in order to further reduce the area in which the gate polysilicon 46 is provided in a top view, the gate polysilicon 46 is preferably provided only between the gate trench portion 40 and the gate runner 130.

Figure 13:
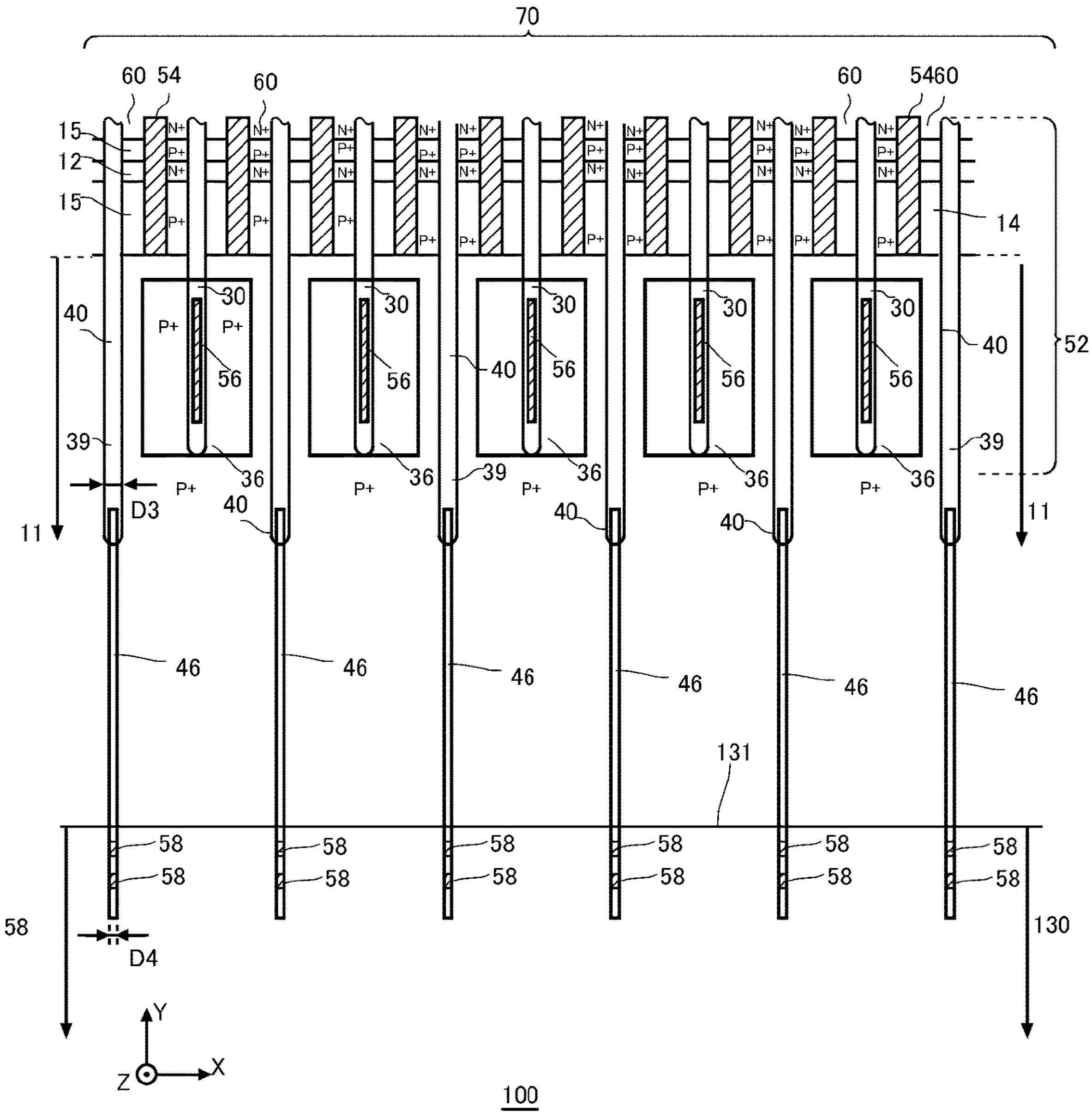
FIG. 13 is a view illustrating another example of the embodiment of the region D in FIG. 1.

FIG. 13 is a view illustrating another example of the embodiment of the region D in FIG. 1. The semiconductor device 100 in FIG. 13 is different from the semiconductor device 100 in FIG. 7 in the configurations of the gate polysilicon 46 and the gate trench portion 40. Other configurations of the semiconductor device 100 in FIG. 13 may be the same as those of the semiconductor device 100 in FIG. 7.

The gate trench portion 40 of the present example has only one linear portion 39 extending along the extending direction perpendicular to the array direction. In the gate trench portion 40 of the present example, the linear portion 39 of one gate trench portion 40 is connected to one gate polysilicon 46.

In the present example, a width D3 of the gate trench portion 40 in the array direction is larger than a width D4 of the gate polysilicon 46 connected to the gate trench portion in the array direction. With such a configuration, the gate polysilicon 46 can be provided only in a region overlapping the gate trench portion 40 in the array direction, and the area in which the gate polysilicon 46 is provided in a top view can be reduced. Therefore, it is possible to increase the region where the thick dielectric film is provided between the gate runner 130 and the circumferential well region 11, and it is possible to suppress the breakdown of the dielectric film at the time of turn-off.

In order to increase the contact area between the gate trench portion 40 and the gate polysilicon 46, the width D4 is preferably large. The width D4 may be 50% or more of the width D3. The width D4 may be 80% or more of the width D3.

In addition, in the present example, the gate polysilicon 46 has a long side in a direction from the gate runner 130 toward the gate trench portion 40. The gate polysilicon 46 has a long side in the extending direction of the gate trench portion 40. In the present example, the gate polysilicon 46 has a long side in the Y axis direction.

Figure 14:
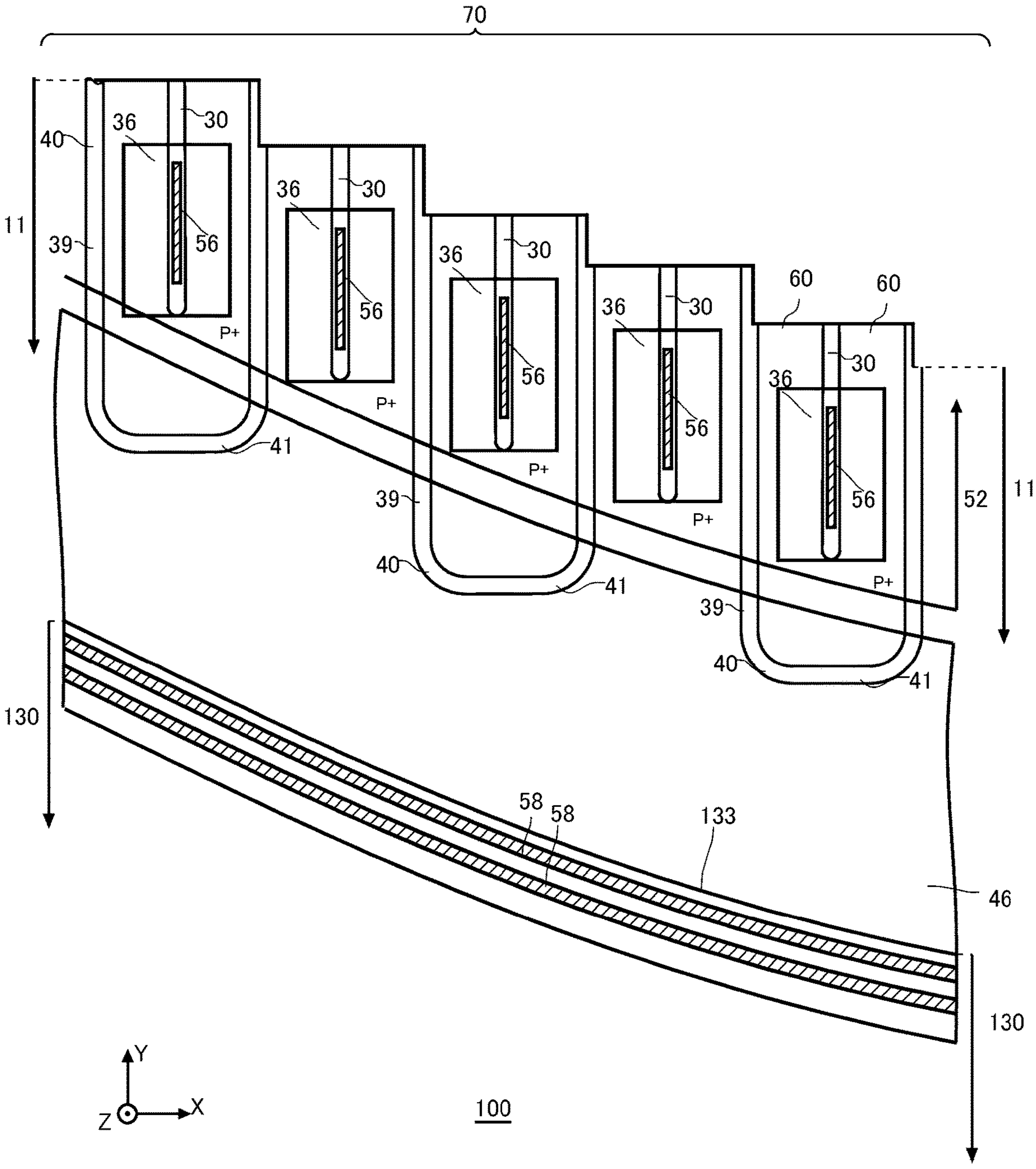
FIG. 14 is a view illustrating a comparative example of a region E in FIG. 1.

FIG. 14 is a view illustrating a comparative example of a region E in FIG. 1. FIG. 14 is an enlarged view of the region E in FIG. 1. The region E is a region including the transistor portion 70 in the vicinity of the curved portion 133 of the gate runner 130. The semiconductor device 100 of the present example includes the gate trench portion 40, the dummy trench portion 30, and the circumferential well region 11 provided inside the upper surface side of the semiconductor substrate 10. In FIG. 14, the emitter region 12 and the contact region 15 are omitted.

The gate polysilicon 46 is provided along the curved portion 133 of the gate runner 130. Therefore, the gate polysilicon 46 also has a curve. In addition, the edge portion 41 of the gate trench portion 40 is provided along the gate polysilicon 46. The circumferential well region 11 may be provided in a stepped shape as illustrated in FIG. 14. In the comparative example, the gate polysilicon 46 is continuously provided in the X axis direction.

Figure 15:
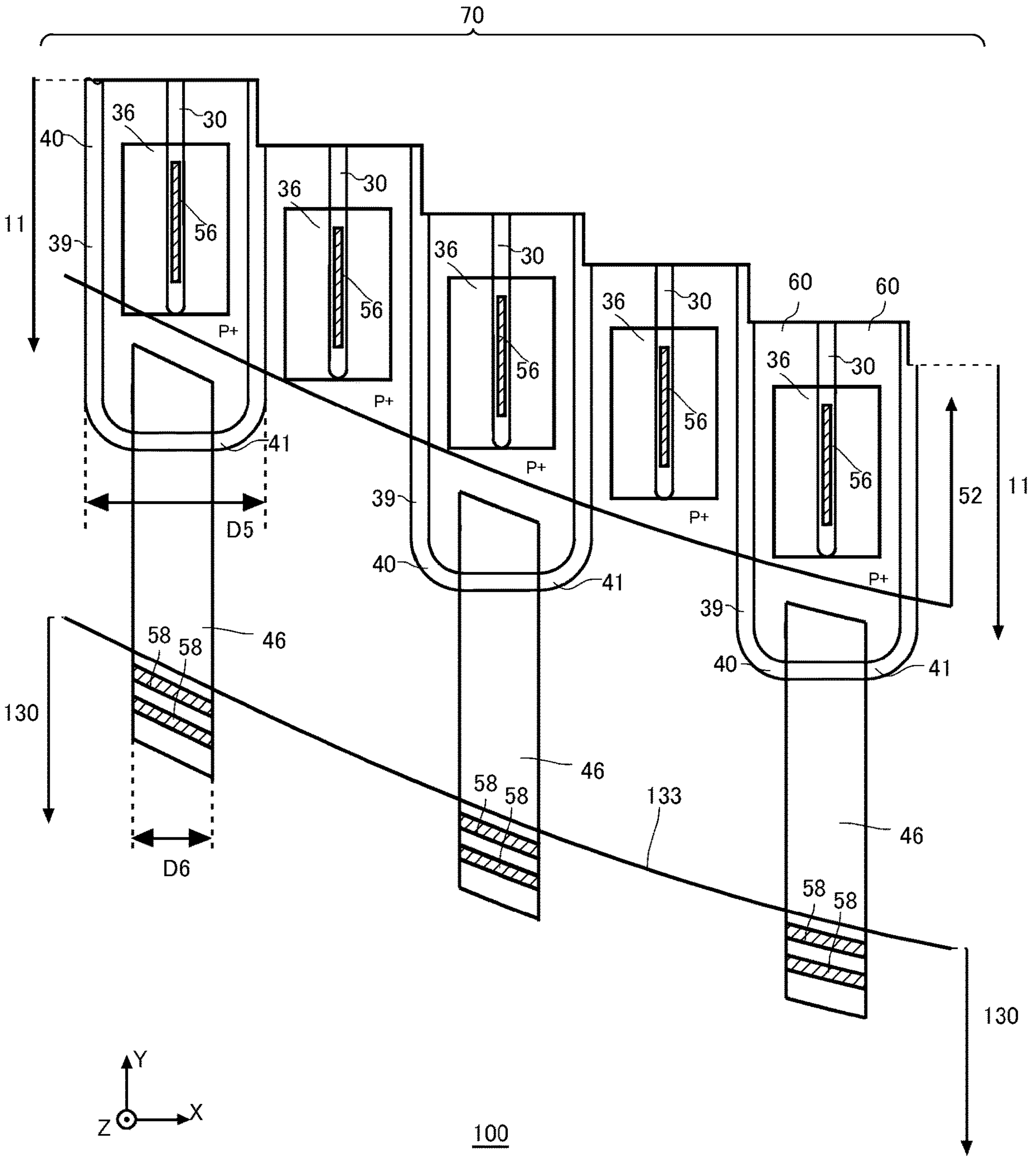
FIG. 15 is a view illustrating an example of an embodiment of the region E in FIG. 1.

FIG. 15 is a view illustrating an example of an embodiment of the region E in FIG. 1. FIG. 15 is an enlarged view of the region E in FIG. 1. The semiconductor device 100 of FIG. 15 is different from the semiconductor device 100 of FIG. 14 in the configuration of the gate polysilicon 46. Other configurations of the semiconductor device 100 of FIG. 15 may be the same as those of the semiconductor device 100 of FIG. 14.

In FIG. 15, a plurality of the gate polysilicon 46 is provided. The plurality of gate polysilicon 46 is provided along the array direction (X axis direction) perpendicular to the extending direction of the gate trench portion 40. The gate polysilicon 46 is discretely provided along the X axis direction. The plurality of gate polysilicon 46 is provided along the curved portion 133 of the gate runner 130. By providing the plurality of gate polysilicon 46, it is possible to reduce the area in which the gate polysilicon 46 is provided in a top view even in the vicinity of the curved portion 133 of the gate runner 130. Therefore, it is possible to increase the region where the thick dielectric film is provided between the gate runner 130 and the circumferential well region 11 in the vicinity of the curved portion 133 of the gate runner 130, and it is possible to suppress the breakdown of the dielectric film at the time of turn-off. In addition, similarly to FIG. 7, one gate trench portion 40 is connected to one gate polysilicon 46 at the edge portion 41.

In FIG. 15, similarly to FIG. 7, a width D5 of the gate trench portion 40 including two linear portions 39 in the array direction may be larger than a width D6 of the gate polysilicon 46 connected to the gate trench portion 40 in the array direction. With such a configuration, the gate polysilicon 46 can be provided only in a region overlapping the gate trench portion 40 in the array direction, and the area in which the gate polysilicon 46 is provided in a top view can be reduced. Therefore, it is possible to increase the region where the thick dielectric film is provided between the gate runner 130 and the circumferential well region 11, and it is possible to suppress the breakdown of the dielectric film at the time of turn-off.

In order to increase the contact area between the gate trench portion 40 and the gate polysilicon 46, the width D6 is preferably large. The width D6 may be 50% or more of the width D5. The width D6 may be 80% or more of the width D5.

In addition, in the present example, the gate polysilicon 46 has a long side in a direction from the gate runner 130 toward the gate trench portion 40. The gate polysilicon 46 has a long side in the extending direction of the gate trench portion 40. In the present example, the gate polysilicon 46 has a long side in the Y axis direction.

Figure 16:
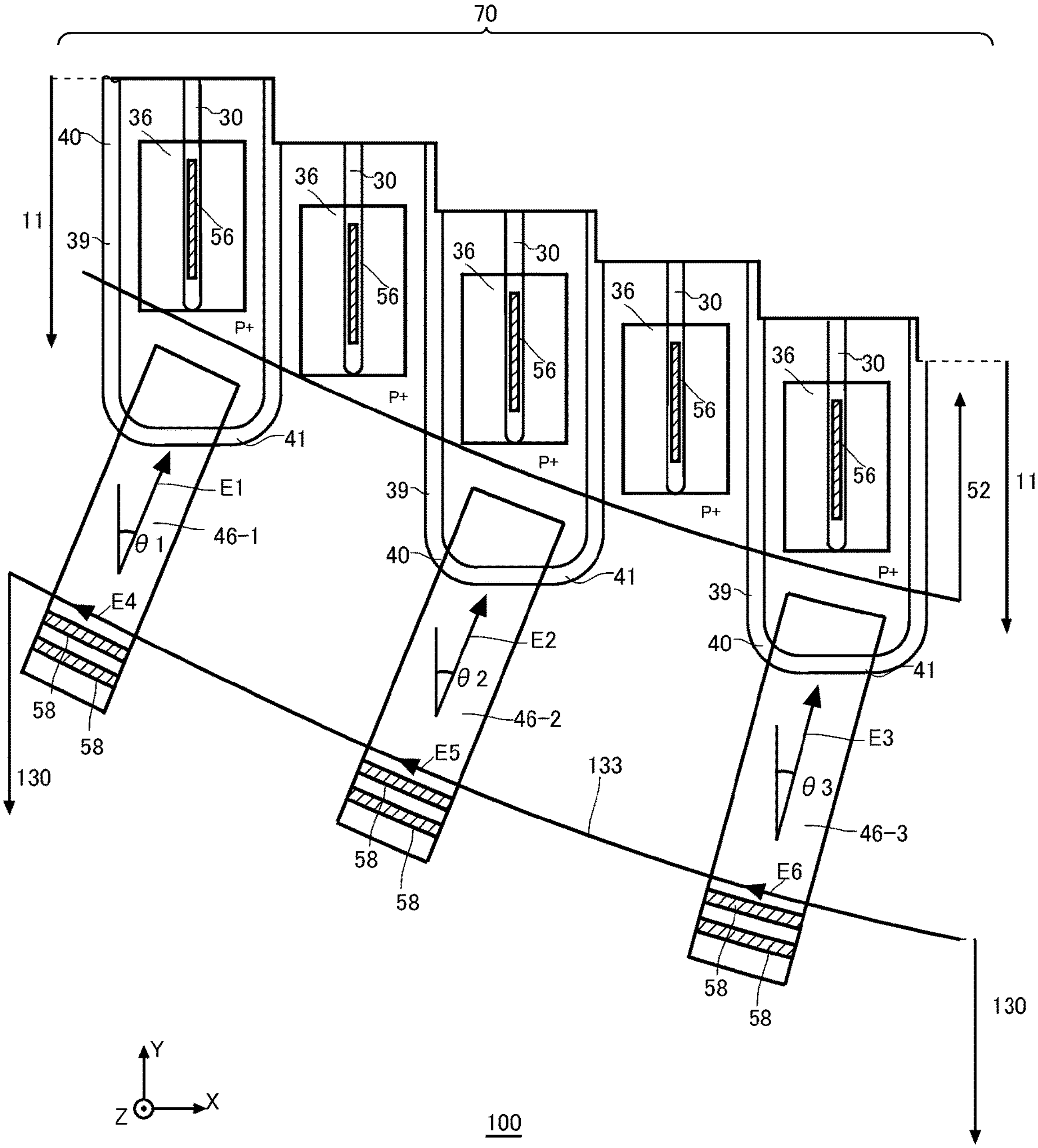
FIG. 16 is a view illustrating another example of the embodiment of the region E in FIG. 1.

FIG. 16 is a view illustrating another example of the embodiment of the region E in FIG. 1. FIG. 16 is an enlarged view of the region E in FIG. 1. The semiconductor device 100 of FIG. 16 is different from the semiconductor device 100 of FIG. 15 in the configuration of the gate polysilicon 46. Other configurations of the semiconductor device 100 of FIG. 16 may be the same as those of the semiconductor device 100 of FIG. 15. The gate polysilicon 46 in FIG. 16 is referred to as gate polysilicon 46-1, gate polysilicon 46-2, and gate polysilicon 46-3 from the negative side in the X axis direction. In addition, the longitudinal directions of respective gate polysilicon 46 are referred to as a longitudinal direction E1, a longitudinal direction E2, and a longitudinal direction E3. In addition, the extending directions of portions of the gate runners 130 connected to the respective gate polysilicon 46 are referred to as an extending direction E4, an extending direction E5, and an extending direction E6.

In the present example, the longitudinal direction of each gate polysilicon 46 is changed on the basis of the extending direction of the portion of the gate runner 130 connected to the gate polysilicon 46. For example, the longitudinal direction of each gate polysilicon 46 is changed to be substantially perpendicular to the extending direction of the portion of the gate runner 130 connected to the gate polysilicon 46. Being substantially perpendicular may include an error of ±10% with respect to being perpendicular. Therefore, in the order of the gate polysilicon 46-1, the gate polysilicon 46-2, and the gate polysilicon 46-3, the angle formed by the longitudinal direction and the extending direction of the gate trench portion 40 is small. By changing the longitudinal direction of each gate polysilicon 46 in this manner, the gate runner 130 and the gate trench portion 40 can be connected at the shortest distance, and the gate potential can be applied without delay.

In the present example, the angles formed by the longitudinal directions of at least two of gate polysilicon 46 with the extending direction (Y axis direction) of the gate trench portion 40 are different from each other. In FIG. 16, an angle θ2 formed by the longitudinal direction E2 of the gate polysilicon 46-2 and the extending direction of the gate trench portion 40 is different from an angle θ3 formed by the longitudinal direction E3 of the gate polysilicon 46-3 and the extending direction of the gate trench portion 40. Note that an angle θ1 formed by the longitudinal direction E1 of the gate polysilicon 46-1 and the extending direction of the gate trench portion 40 and the angle θ2 formed by the longitudinal direction E2 of the gate polysilicon 46-2 and the extending direction of the gate trench portion 40 may be different or the same. The angle θ1, the angle θ2, and the angle θ3 may be different from each other.

As shown in FIG. 16, the angles θ1, θ2, and θ3 between the longitudinal directions E1, E2, and E3 of some of the plurality of the gate polysilicon 46 and the extending direction, which the same as the Y direction in FIG. 16, are acute. In other words, the angles θ1, θ2, and θ3 are greater than zero but less than 90°. As can be seen in FIG. 16, these same gate polysilicon 46 have longitudinal directions E1, E2, and E3 that form acute angles with the X direction, which is the direction perpendicular to the extending direction. Accordingly, the angles between the longitudinal directions E1, E2, and E3 and the X direction are greater than zero but less than 90°.

Figure 17:
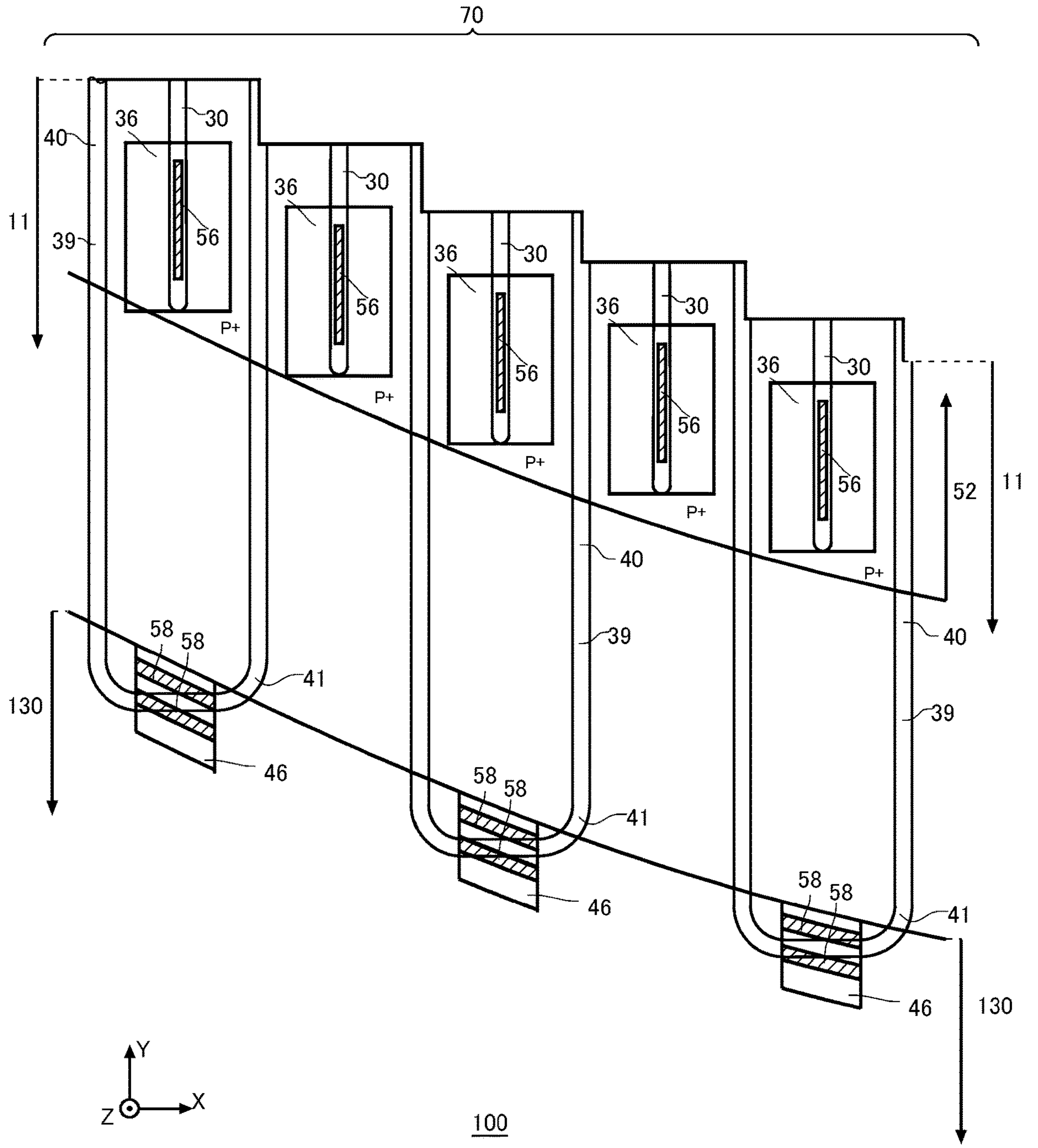
FIG. 17 is a view illustrating another example of the embodiment of the region E in FIG. 1.

FIG. 17 is a view illustrating another example of the embodiment of the region E in FIG. 1. FIG. 17 is an enlarged view of the region E in FIG. 1. The semiconductor device 100 in FIG. 17 is different from the semiconductor device 100 in FIG. 15 in the configurations of the gate polysilicon 46 and the gate trench portion 40. Other configurations of the semiconductor device 100 of FIG. 17 may be the same as those of the semiconductor device 100 of FIG. 15.

In the present example, at least a part of the gate trench portion 40 is provided to extend to the gate runner 130. In addition, at least a part of the gate trench portion 40 is provided to extend to the lower side of the gate runner 130. In FIG. 17, the edge portion 41 of the gate trench portion 40 overlaps the gate runner 130 in a top view. By providing at least a part of the gate trench portion 40 up to the gate runner 130, the area in which the gate polysilicon 46 is provided in a top view can be further reduced. Therefore, it is possible to increase the region where the thick dielectric film is provided between the gate runner 130 and the circumferential well region 11, and it is possible to suppress the breakdown of the dielectric film at the time of turn-off. As illustrated in FIG. 12, the gate polysilicon 46 may be provided between the gate trench portion 40 and the gate runner 130 in the depth direction.

The embodiment of the region D and the embodiment of the region E may be appropriately combined. For example, the embodiment of FIG. 7 and the embodiment of FIG. 16 are combined. In FIG. 7, the extending direction of the gate runner 130 is substantially perpendicular to the longitudinal direction of each gate polysilicon 46. By having the configuration of FIG. 7 in the vicinity of the first wiring 131 and having the configuration of FIG. 16 in the vicinity of the curved portion 133, the longitudinal direction of each gate polysilicon 46 can be changed on the basis of the extending direction of the portion of the gate runner 130 connected to the gate polysilicon 46 over the entire gate runner 130. By combining the embodiment of FIG. 7 and the embodiment of FIG. 16, each gate trench portion 40 and the gate runner 130 can be connected at the shortest distance. When the embodiment of FIG. 7 and the embodiment of FIG. 16 are combined, the longitudinal direction of the gate polysilicon 46 connected to the first wiring 131 is different from the longitudinal direction of the gate polysilicon 46 connected to the curved portion 133.

In addition, the embodiment of FIG. 7 and the embodiment of FIG. 17 may be combined. In this case, as illustrated in FIG. 17, at least a part of the gate trench portion 40 is provided to extend to the lower side of the curved portion 133 of the gate runner 130. In addition, at least one gate polysilicon 46 is provided between the gate trench portion 40 and the curved portion 133 in the depth direction. In addition, as illustrated in FIG. 7, at least one gate polysilicon 46 has a long side in a direction from the first wiring 131 of the gate runner 130 toward the gate trench portion 40. Examples of combinations of the embodiments are not limited thereto.

Figure 18:
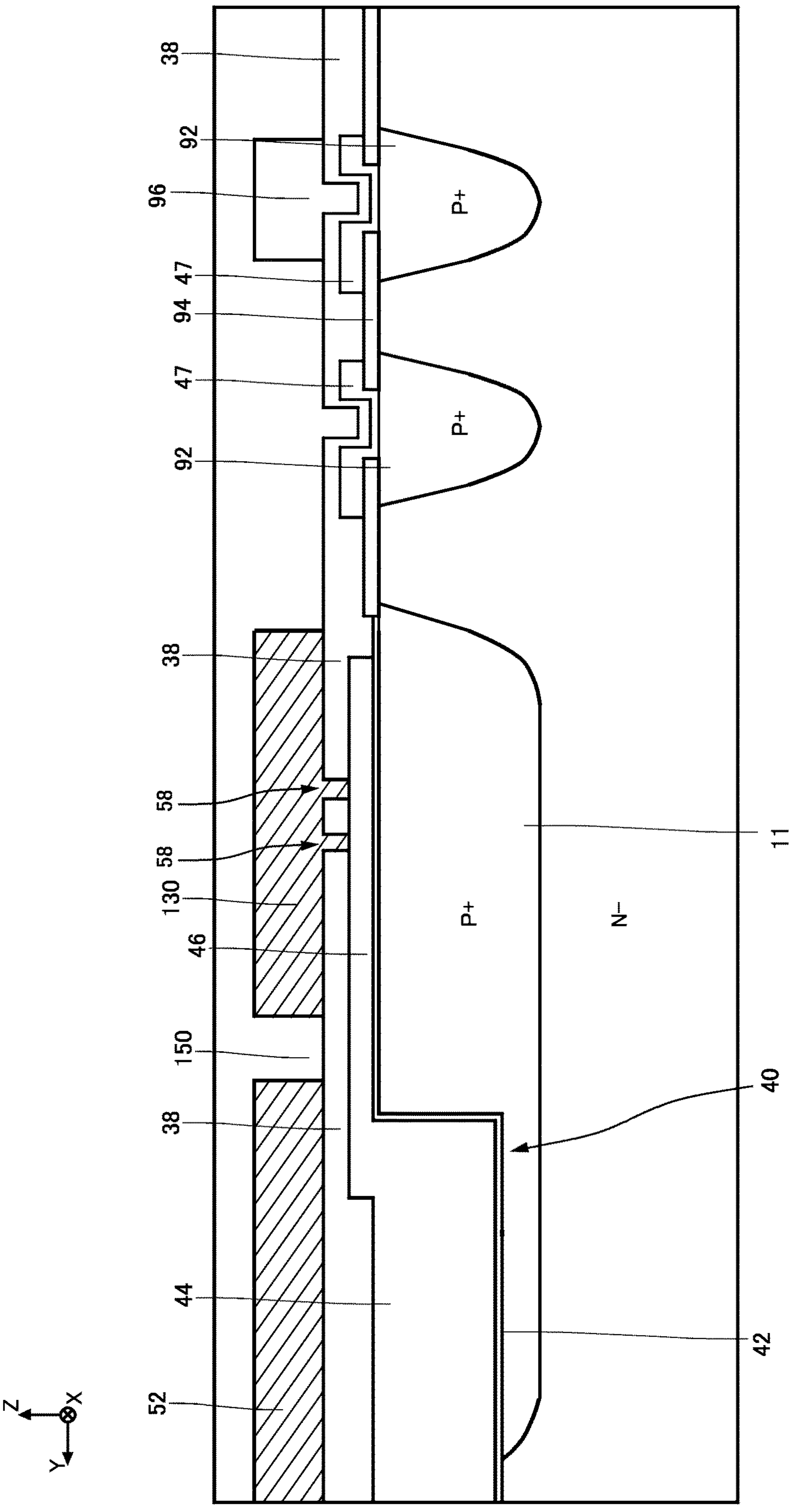
FIG. 18 is a view illustrating an example of an edge termination structure portion 90.

FIG. 18 is a view illustrating an example of the edge termination structure portion 90. FIG. 18 illustrates the edge termination structure portion 90 in the vicinity of the c-c cross section of FIG. 6. The edge termination structure portion 90 is provided with polysilicon 47, a plurality of guard rings 92, an oxide film 94, and a field plate 96.

Each guard ring 92 may be provided to surround the active portion 160 on the upper surface 21. The plurality of guard rings 92 may have a function of spreading the depletion layer generated in the active portion 160 to the outside of the semiconductor substrate 10. With this configuration, it is possible to prevent an electric field strength inside the semiconductor substrate 10 and to improve the breakdown voltage of the semiconductor device 100.

The guard ring 92 of the present example is a P+ type semiconductor region formed by ion irradiation in the vicinity of the upper surface 21. A depth of the bottom of the guard ring 92 may be deeper than a depth of the bottom of the gate trench portion 40 and the dummy trench portion 30.

The upper surface of the guard ring 92 is covered with the interlayer dielectric film 38 and the oxide film 94. The field plate 96 is formed of a conductive material such as metal. The field plate 96 may be formed of the same material as the emitter electrode 52. The field plate 96 is provided on the interlayer dielectric film 38. The field plate 96 is connected to the guard ring 92 via the polysilicon 47. As described above, in the edge termination structure portion 90, a hole current flowing out from the edge termination structure portion 90 to the emitter electrode 52 is generated at the time of turn-off.

Figure 19:
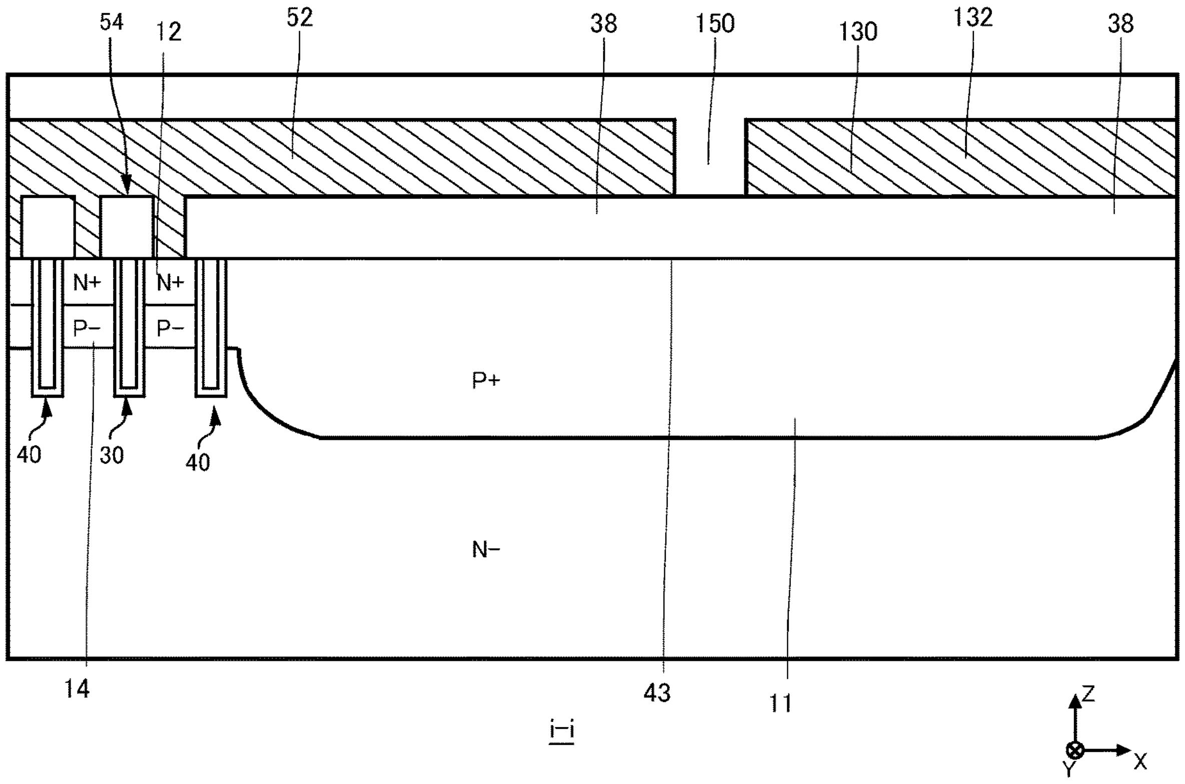
FIG. 19 is a view illustrating an example of an i-i cross section in FIG. 1.

FIG. 19 is a view illustrating an example of an i-i cross section in FIG. 1. The i-i cross section is an XZ plane passing through the second wiring 132 of the gate runner 130. Note that the dimensions in FIG. 19 do not necessarily match those of the other drawings.

In the cross section, the gate trench portion 40 is not connected to the gate runner 130. Therefore, the gate polysilicon 46 is not provided. The gate polysilicon 46 may not be provided below the second wiring 132 of the gate runner 130. As illustrated in FIG. 8, the gate polysilicon 46 may be provided below the first wiring 131 of the gate runner 130. With such a configuration, it is possible to increase the region where the thick dielectric film is provided between the gate runner 130 and the circumferential well region 11 in the vicinity of the second wiring 132 of the gate runner 130, and it is possible to suppress the breakdown of the dielectric film at the time of turn-off.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the present invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A semiconductor device comprising a semiconductor substrate, wherein the semiconductor substrate has:

an active portion;

a circumferential well region surrounding the active portion;

a plurality of gate trench portions provided in the active portion on an upper surface of the semiconductor substrate and extending along an extending direction; and a plurality of dummy trench portions provided in the active portion on the upper surface of the semiconductor substrate and extending along the extending direction, the semiconductor device further comprising:

a gate runner provided between the active portion and an end side of the semiconductor substrate, the gate runner having a portion extending in a direction perpendicular to the extending direction in top view; and a plurality of gate polysilicon disposed apart from each other and distributed along the portion of the gate runner extending in the direction perpendicular to the extending direction in top view and each of the plurality of gate polysilicon connecting one or more corresponding gate trench portions of the plurality of gate trench portions to the gate runner, wherein a distance in the extending direction from each of the plurality of dummy trench portions to the portion of the gate runner extending in the direction perpendicular to the extending direction in top view is longer than a distance in the extending direction from each of the plurality of gate trench portions to the portion of the gate runner extending in the direction perpendicular to the extending direction in top view, each of the plurality of gate polysilicon has a lower surface, and in a depth direction of the semiconductor substrate, a lower surface of the gate runner is farther from the upper surface of the semiconductor substrate than the lower surface of each of the plurality of gate polysilicon.

2. The semiconductor device according to claim 1, wherein at least one of the gate trench portions has:

two linear portions extending along the extending direction; and an edge portion connecting the two linear portions, and a width of the gate trench portion including the two linear portions in an array direction perpendicular to the extending direction is larger than a width of the gate polysilicon connected to the gate trench portion in the array direction.

3. The semiconductor device according to claim 1, wherein at least one of the gate trench portions has one linear portion extending along the extending direction, and a width of the gate trench portion in an array direction perpendicular to the extending direction is larger than a width of the gate polysilicon connected to the gate trench portion in the array direction.

4. The semiconductor device according to claim 1, wherein the semiconductor substrate has:

two first end sides perpendicular to the extending direction; and two second end sides parallel to the extending direction, the gate runner has:

a first wiring provided between the first end side and the active portion; and a second wiring provided between the second end side and the active portion, and the gate polysilicon is provided below the first wiring, and not provided below the second wiring.

5. The semiconductor device according to claim 1, wherein the gate polysilicon has a long side in a direction from the gate runner toward the gate trench portion.

6. The semiconductor device according to claim 5, wherein the gate polysilicon has a long side in the extending direction.

7. The semiconductor device according to claim 1, wherein at least a part of each of the plurality of gate trench portions is provided to extend to a location below the lower surface of the gate runner, and each of the plurality of gate polysilicon is provided between its corresponding one or more of the plurality of gate trench portions and the gate runner in a depth direction.

8. The semiconductor device according to claim 1, wherein the gate runner further comprises at least one curved portion extending from an end of the portion of the gate runner extending in the direction perpendicular to the extending direction in top view, the plurality of gate polysilicon are distributed along the curved portion of the gate runner and the portion of the gate runner extending in the direction perpendicular to the extending direction in top view, angles formed by longitudinal directions of at least two gate polysilicon of the plurality of gate polysilicon with the extending direction are different from each other, and the angle formed with the extending direction and an angle formed with the direction perpendicular to the extending direction in top view by at least one of the two gate polysilicon are both greater than zero.

9. The semiconductor device according to claim 8, wherein the semiconductor substrate has:

two first end sides perpendicular to the extending direction; and two second end sides parallel to the extending direction, the gate runner comprises:

a first wiring provided between the first end side and the active portion;

a second wiring provided between the second end side and the active portion; and a curved portion connecting the first wiring and the second wiring, and a longitudinal direction of the gate polysilicon connected to the first wiring is different from a longitudinal direction of the gate polysilicon connected to the curved portion.

10. The semiconductor device according to claim 1, wherein the semiconductor substrate has:

two first end sides perpendicular to the extending direction; and two second end sides parallel to the extending direction, the gate runner comprises:

a first wiring provided between the first end side and the active portion;

a second wiring provided between the second end side and the active portion; and a curved portion connecting the first wiring and the second wiring, at least a part of the gate trench portion is provided to extend to a lower side of the curved portion of the gate runner, at least one of the gate polysilicon is provided between the gate trench portion and the curved portion in a depth direction, and at least one of the gate polysilicon has a long side in a direction from the first wiring of the gate runner toward the gate trench portion.

11. The semiconductor device according to claim 2, wherein the semiconductor substrate has:

two first end sides perpendicular to the extending direction; and two second end sides parallel to the extending direction, the gate runner has:

a first wiring provided between the first end side and the active portion; and a second wiring provided between the second end side and the active portion, and the gate polysilicon is provided below the first wiring, and not provided below the second wiring.

12. The semiconductor device according to claim 3, wherein the semiconductor substrate has:

two first end sides perpendicular to the extending direction; and two second end sides parallel to the extending direction, the gate runner has:

a first wiring provided between the first end side and the active portion; and a second wiring provided between the second end side and the active portion, and the gate polysilicon is provided below the first wiring, and not provided below the second wiring.

13. The semiconductor device according to claim 2, wherein the gate polysilicon has a long side in a direction from the gate runner toward the gate trench portion.

14. The semiconductor device according to claim 3, wherein the gate polysilicon has a long side in a direction from the gate runner toward the gate trench portion.

15. The semiconductor device according to claim 7, wherein a portion of each of the plurality of gate trench portions is overlapped by the portion of the gate runner extending in the direction perpendicular to the extending direction in top view.

16. The semiconductor device according to claim 1, wherein a portion of each of the plurality of gate trench portions is overlapped by the portion of the gate runner extending in the direction perpendicular to the extending direction in top view.

17. A semiconductor device comprising a semiconductor substrate, wherein the semiconductor substrate has:

an active portion; and a plurality of gate trench portions provided in the active portion on an upper surface of the semiconductor substrate and extending along an extending direction, the semiconductor device further comprising:

a gate runner provided between the active portion and an end side of the semiconductor substrate, the gate runner having a portion extending in a direction perpendicular to the extending direction in top view; and a plurality of gate polysilicon disposed apart from each other and distributed along the portion of the gate runner extending in the direction perpendicular to the extending direction in top view and each of the plurality of gate polysilicon connecting one or more corresponding gate trench portions of the plurality of gate trench portions to the gate runner, wherein each of the plurality of gate polysilicon has a lower surface, in a depth direction of the semiconductor substrate, a lower surface of the gate runner is farther from the upper surface of the semiconductor substrate than the lower surface of each of the plurality of gate polysilicon, at least one gate trench portion of the plurality of gate trench portions has one linear portion extending along the extending direction, and a width of the linear portion of the at least one gate trench portion in an array direction perpendicular to the extending direction is larger than a width, in the array direction, of a corresponding gate polysilicon of the plurality of gate polysilicon that is connected to the at least one gate trench portion.

* * * * *